United States Patent
Ching et al.

(10) Patent No.: US 10,847,513 B2
(45) Date of Patent: Nov. 24, 2020

(54) BURIED INTERCONNECT CONDUCTOR

(71) Applicant: Taiwan Semiconductor Manufacturing Co., Ltd., Hsinchu (TW)

(72) Inventors: Kuo-Cheng Ching, Hsinchu County (TW); Shi Ning Ju, Hsinchu (TW); Kuan-Ting Pan, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/407,751

(22) Filed: May 9, 2019

(65) Prior Publication Data

US 2019/0267375 A1   Aug. 29, 2019

Related U.S. Application Data

(62) Division of application No. 15/698,030, filed on Sep. 7, 2017, now Pat. No. 10,290,635.

(Continued)

(51) Int. Cl.
*H01L 27/088* (2006.01)
*H01L 21/762* (2006.01)
(Continued)

(52) U.S. Cl.
CPC ...... *H01L 27/0886* (2013.01); *H01L 21/3081* (2013.01); *H01L 21/74* (2013.01);
(Continued)

(58) Field of Classification Search
CPC ........... H01L 21/823475; H01L 21/743; H01L 21/823871; H01L 27/0866
See application file for complete search history.

(56) References Cited

U.S. PATENT DOCUMENTS 8,674,413 B1 * 3/2014 Chi .................. H01L 27/0924
                                              257/213
8,772,109 B2   7/2014 Colinge
(Continued)

OTHER PUBLICATIONS

Bardon, M. Garcia et al., "Extreme Scaling enabled by 5 Tracks Cells: Holistic design-device co-optimization for FinFETs and Lateral Nanowires", 2016 IEEE International Electron Devices Meeting (IEDM), San Francisco, CA, Dec. 3, 2016-Dec. 7, 2016, 4 pages.

*Primary Examiner* — John A Bodnar
(74) *Attorney, Agent, or Firm* — Haynes and Boone, LLP

(57) ABSTRACT

Various examples of a buried interconnect line are disclosed herein. In an example, a device includes a fin disposed on a substrate. The fin includes an active device. A plurality of isolation features are disposed on the substrate and below the active device. An interconnect is disposed on the substrate and between the plurality of isolation features such that the interconnect is below a topmost surface of the plurality of isolation features. The interconnect is electrically coupled to the active device. In some such examples, a gate stack of the active device is disposed over a channel region of the active device and is electrically coupled to the interconnect. In some such examples, a source/drain contact is electrically coupled to a source/drain region of the active device, and the source/drain contact is electrically coupled to the interconnect.

20 Claims, 20 Drawing Sheets

Related U.S. Application Data

(60) Provisional application No. 62/537,168, filed on Jul. 26, 2017.

(51) Int. Cl.

| | | |
|---|---|---|
| *H01L 23/535* | (2006.01) | |
| *H01L 29/78* | (2006.01) | |
| *H01L 23/528* | (2006.01) | |
| *H01L 29/06* | (2006.01) | |
| *H01L 21/8234* | (2006.01) | |
| *H01L 29/66* | (2006.01) | |
| *H01L 21/308* | (2006.01) | |
| *H01L 21/74* | (2006.01) | |
| *H01L 21/3065* | (2006.01) | |
| *H01L 21/768* | (2006.01) | |

(52) U.S. Cl.
CPC ...... *H01L 21/743* (2013.01); *H01L 21/76224* (2013.01); *H01L 21/823431* (2013.01); *H01L 21/823475* (2013.01); *H01L 21/823481* (2013.01); *H01L 23/528* (2013.01); *H01L 23/535* (2013.01); *H01L 29/0649* (2013.01); *H01L 29/66545* (2013.01); *H01L 29/7851* (2013.01); *H01L 21/3065* (2013.01); *H01L 21/3086* (2013.01); *H01L 21/76802* (2013.01); *H01L 21/76877* (2013.01); *H01L 21/76895* (2013.01); *H01L 21/823437* (2013.01); *H01L 29/7848* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2014/0021554 A1 | 1/2014 | Anderson et al. |
| 2017/0062421 A1 | 3/2017 | Cosemans et al. |
| 2017/0194212 A1* | 7/2017 | Hung .................. H01L 29/165 |
| 2017/0278845 A1* | 9/2017 | Tung ................ H01L 21/30625 |
| 2019/0035785 A1 | 1/2019 | Ching et al. |

* cited by examiner

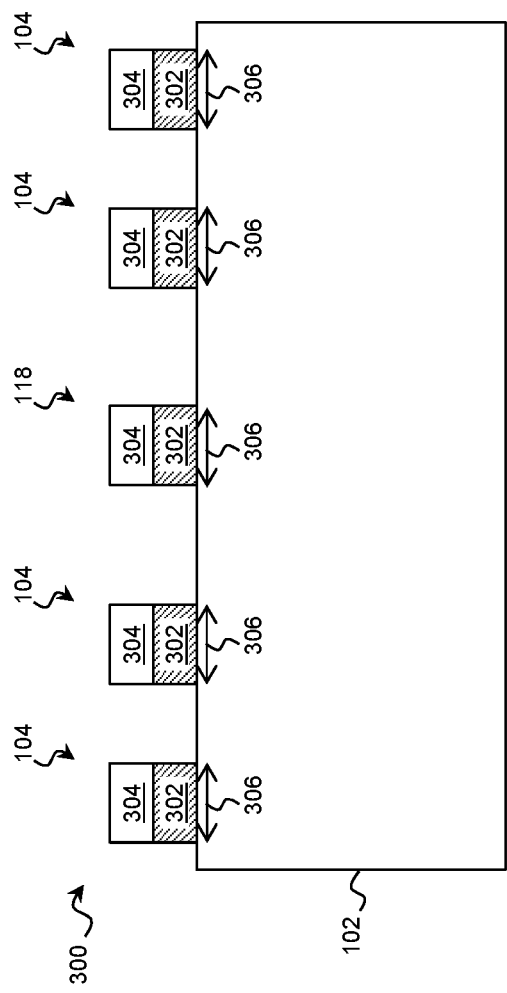
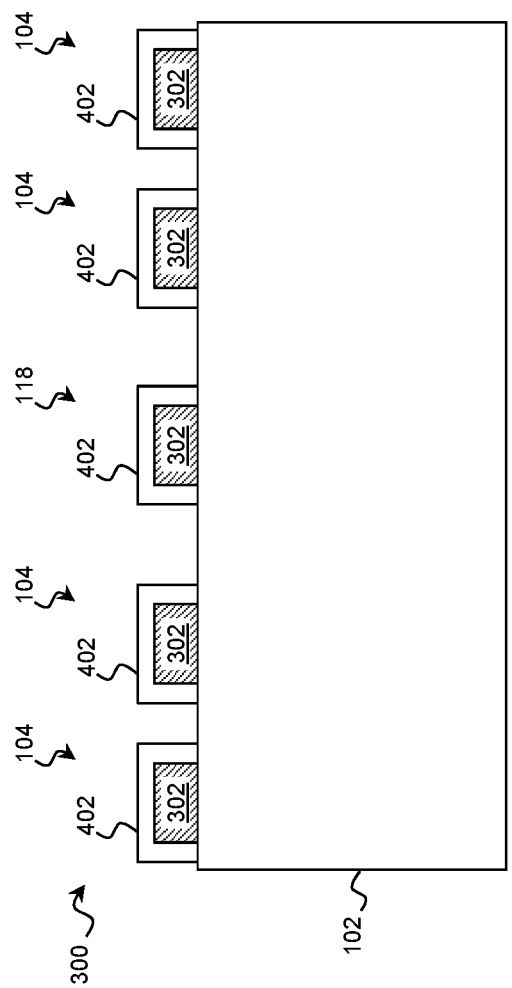

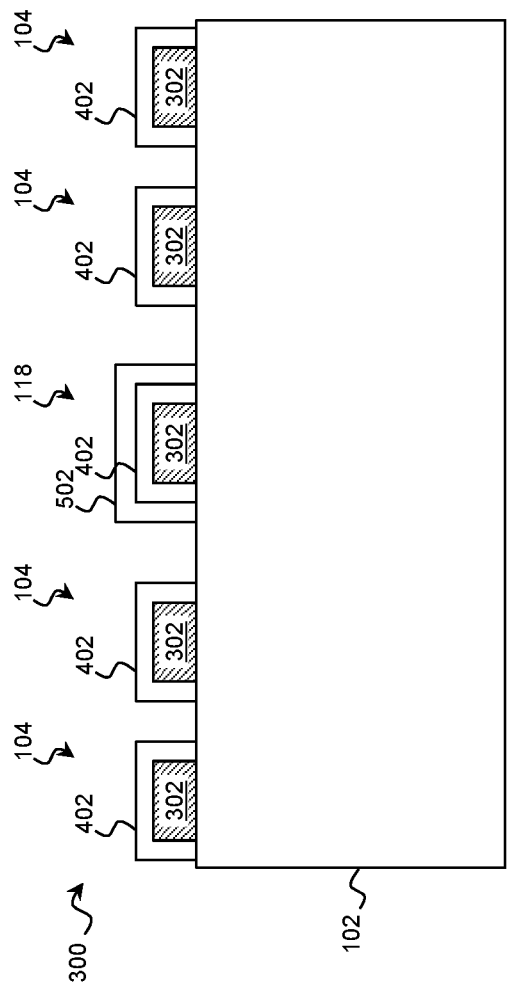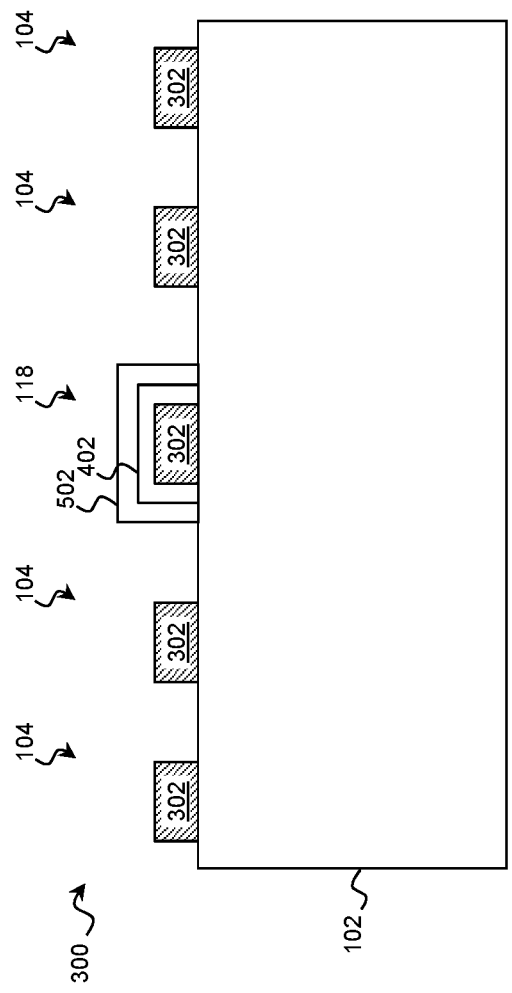

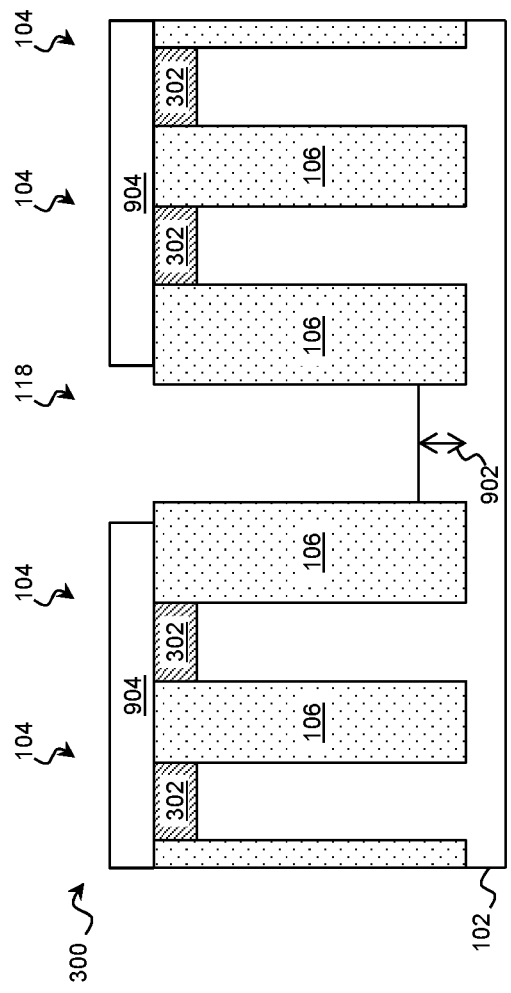
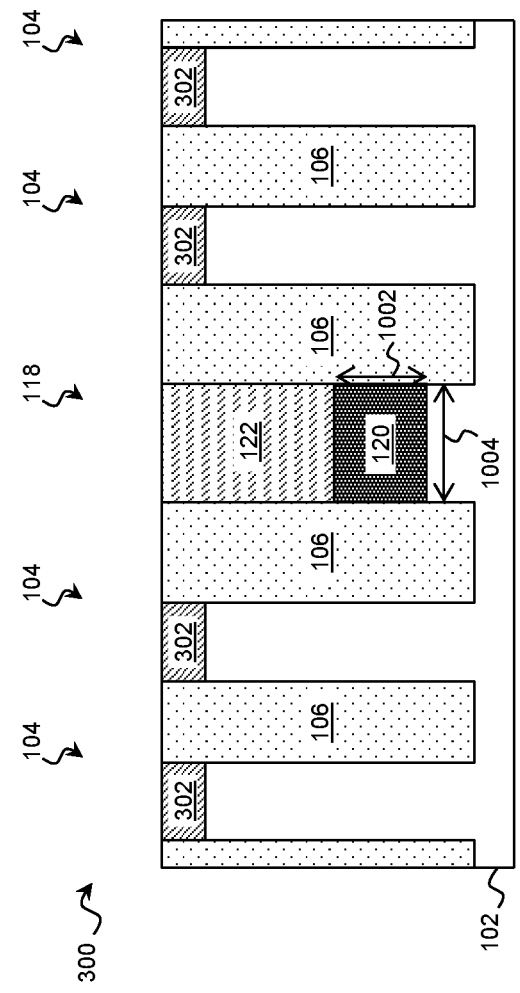

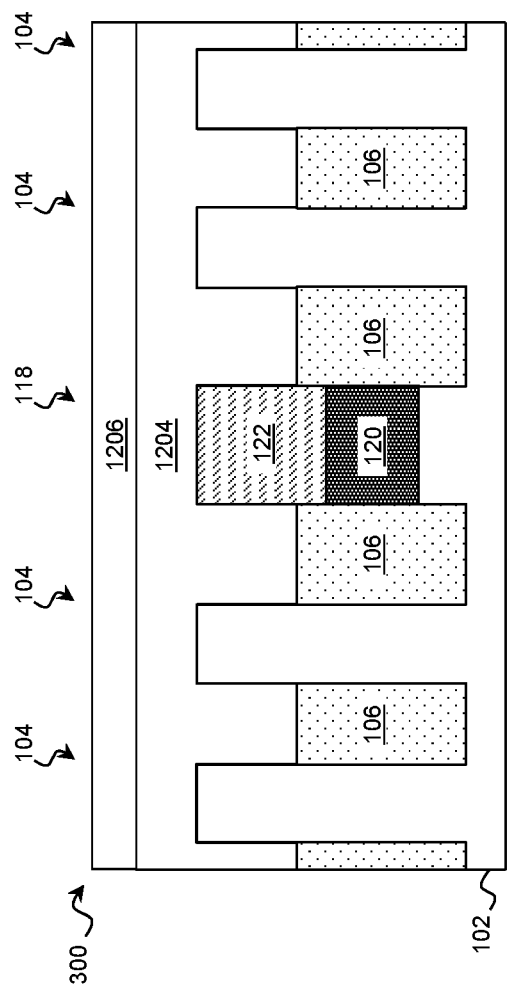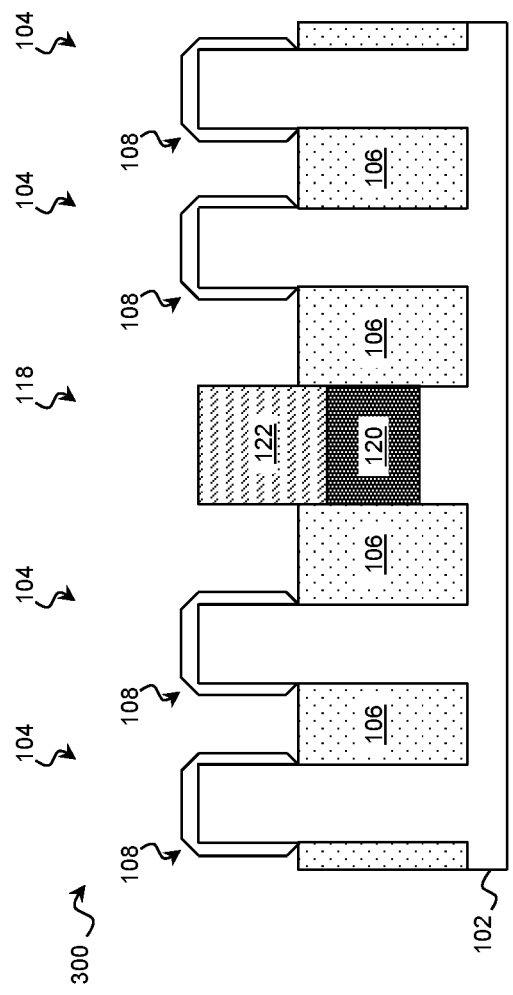

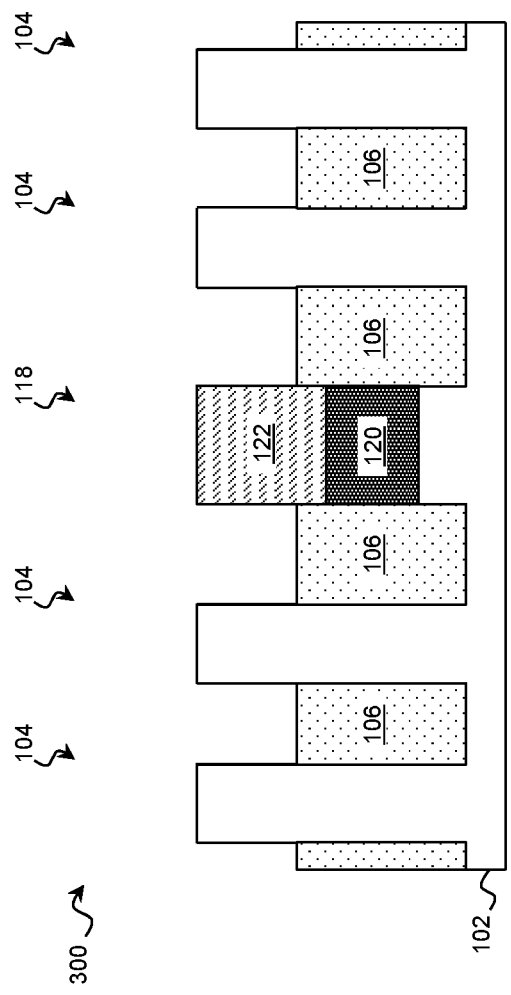
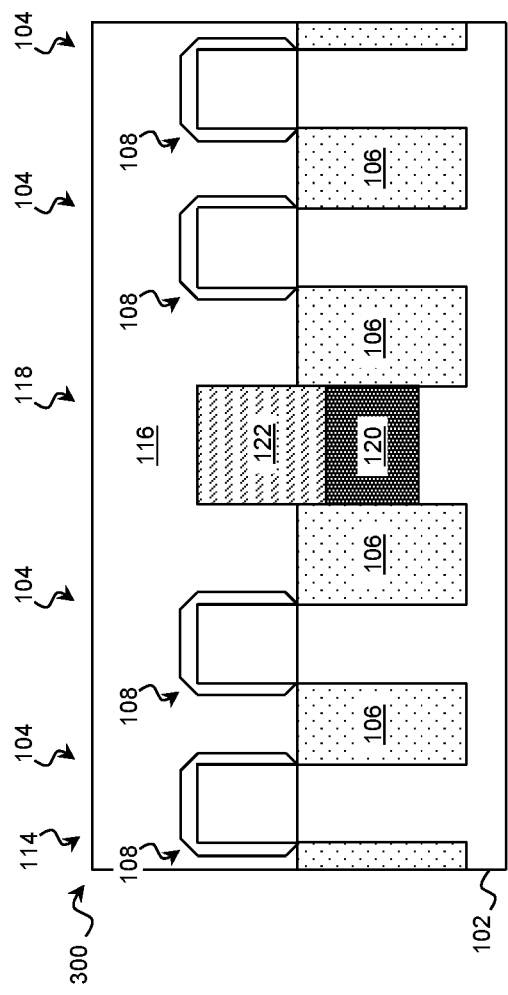
FIG. 15A
FIG. 15B

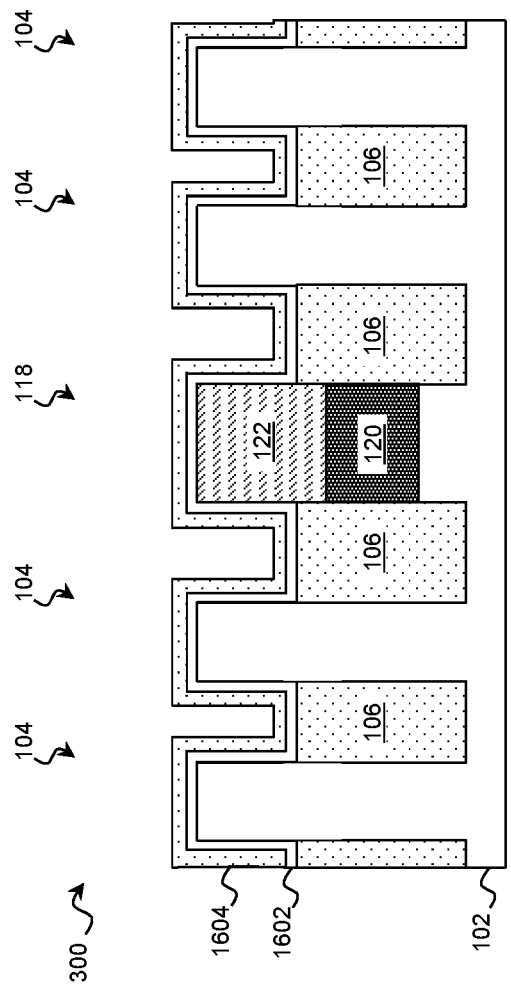
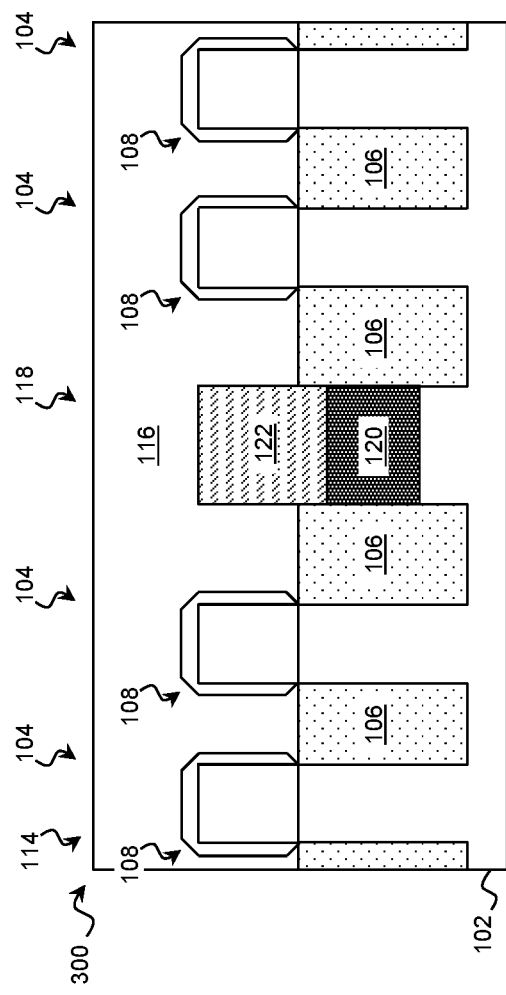
FIG. 16A
FIG. 16B

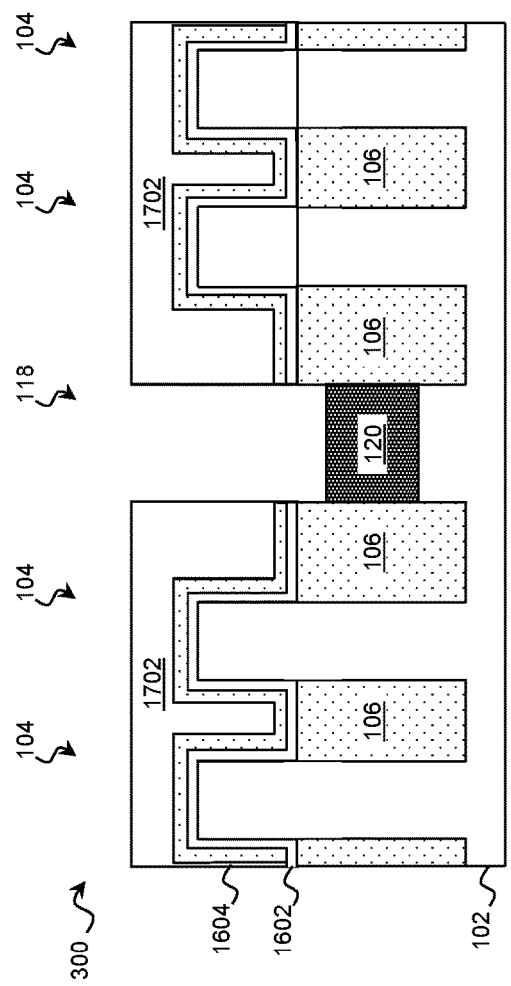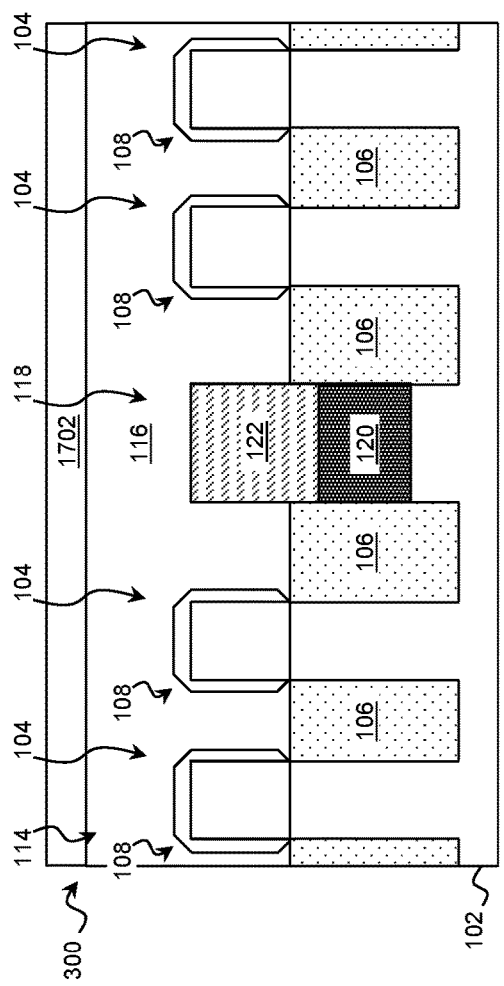
FIG. 17A
FIG. 17B

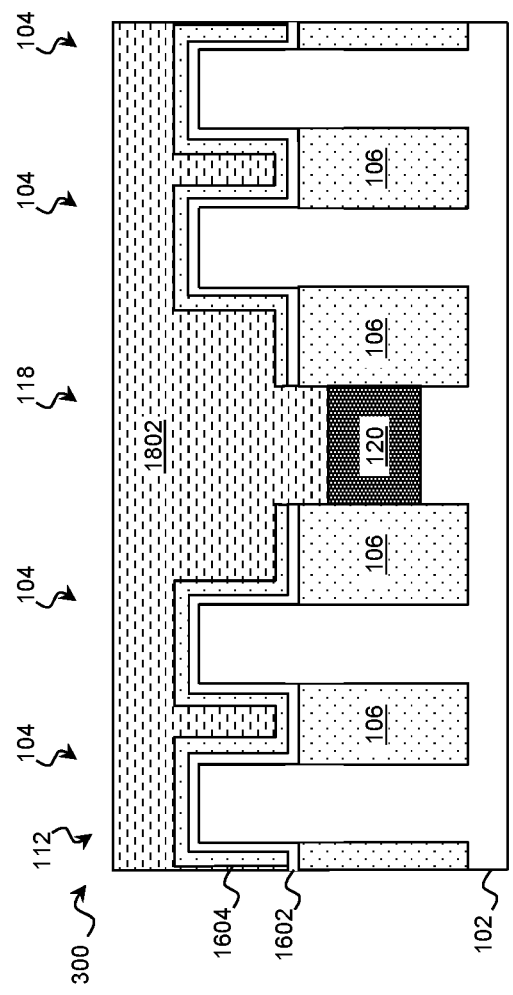
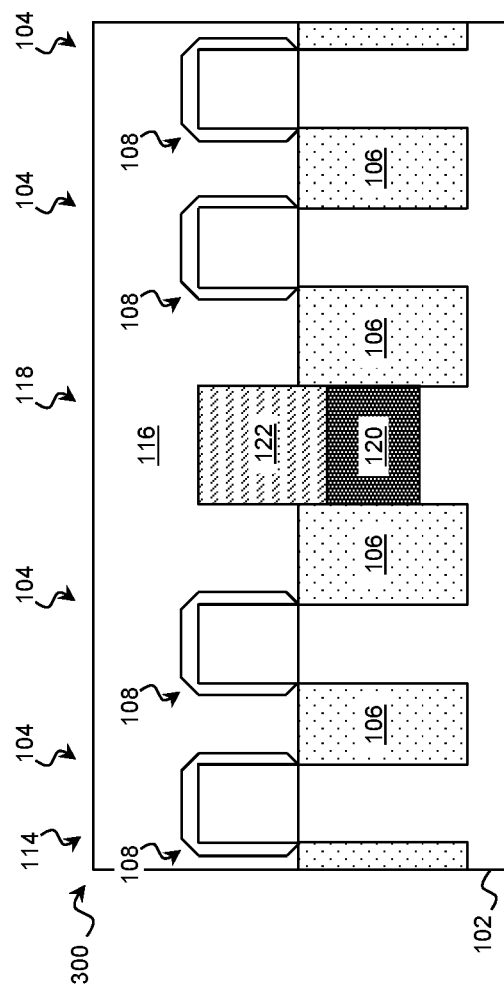
FIG. 18A
FIG. 18B

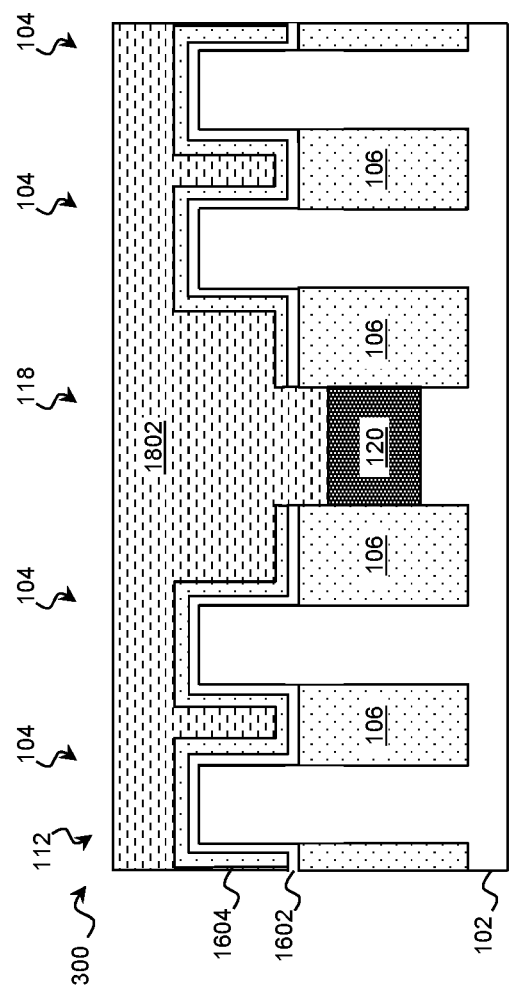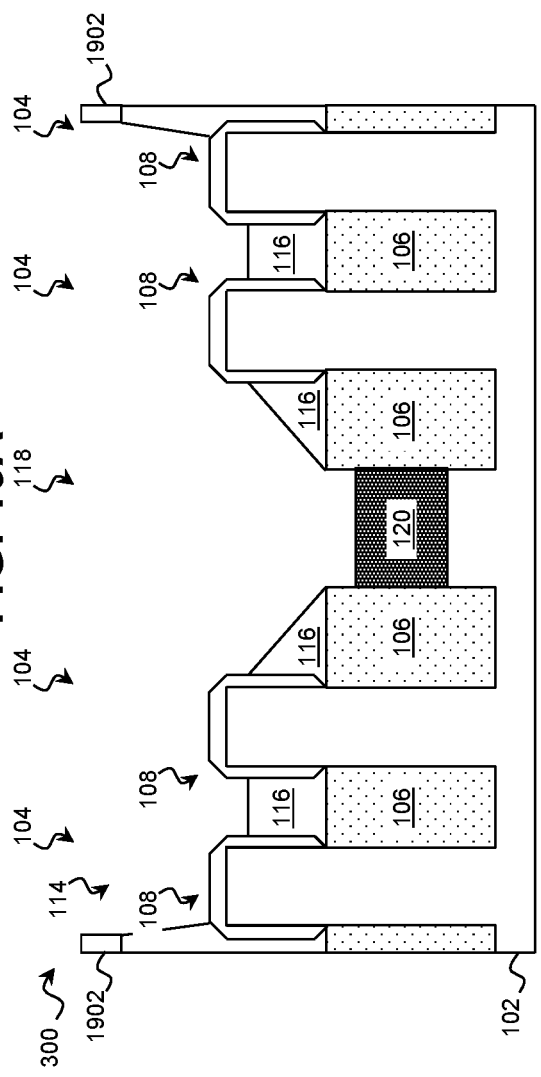
FIG. 19A
FIG. 19B

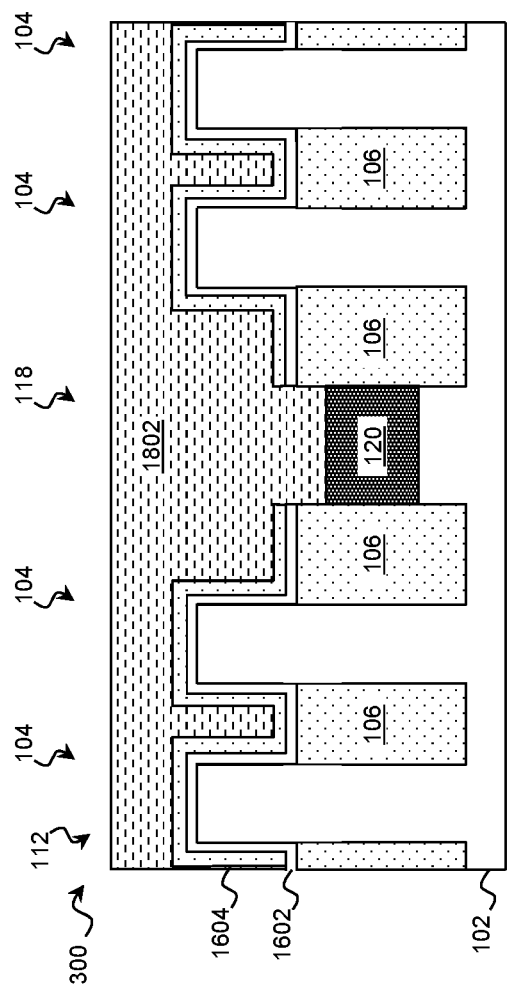
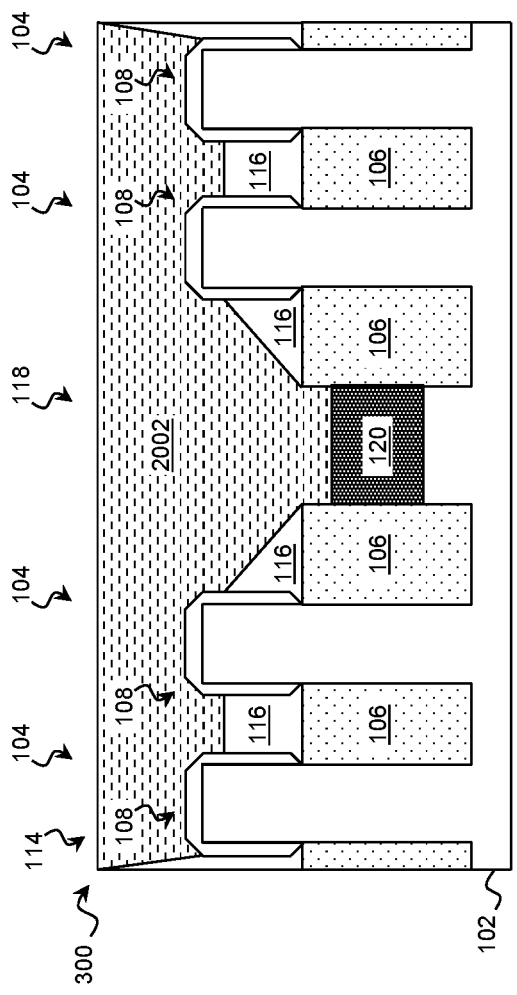
FIG. 20A
FIG. 20B

BURIED INTERCONNECT CONDUCTOR

PRIORITY DATA

The present application is a divisional application of U.S. patent application Ser. No. 15/698,030, filed Sep. 7, 2017, which claims the benefit of U.S. Provisional Application No. 62/537,168, entitled "Buried Interconnect Conductor," filed Jul. 26, 2017, each of which is herein incorporated by reference in its entirety.

BACKGROUND

The semiconductor industry has progressed into nanometer technology process nodes in pursuit of higher device density, higher performance, and lower cost. Beyond merely shrinking devices, circuit designers are looking to novel structures to deliver even greater performance. One avenue of inquiry is the development of three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

To electrically coupled the FinFETs and other devices, an integrated circuit may include an interconnect structure with one or more layers of conductive lines electrically coupled to the devices. The overall circuit size and performance may depend on the number and size of the conductive lines as well as the circuit devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3B and 4-11 are cross-sectional diagrams taken along a channel region of the workpiece at various stages of the method of fabricating the workpiece with a buried interconnect line according to various aspects of the present disclosure.

FIGS. 13A, 14A, 15A, 16A, 17A, 18A, 19A, 20A, and 21A are cross-sectional diagrams taken along the channel region of the workpiece at various stages of the method of fabricating the workpiece with the buried interconnect line according to various aspects of the present disclosure.

FIGS. 13B, 14B, 15B, 16B, 17B, 18B, 19B, 20B, and 21B are cross-sectional diagrams taken along a source/drain feature of the workpiece at various stages of the method of fabricating the workpiece with the buried interconnect line according to various aspects of the present disclosure.

DETAILED DESCRIPTION

Figure 1:
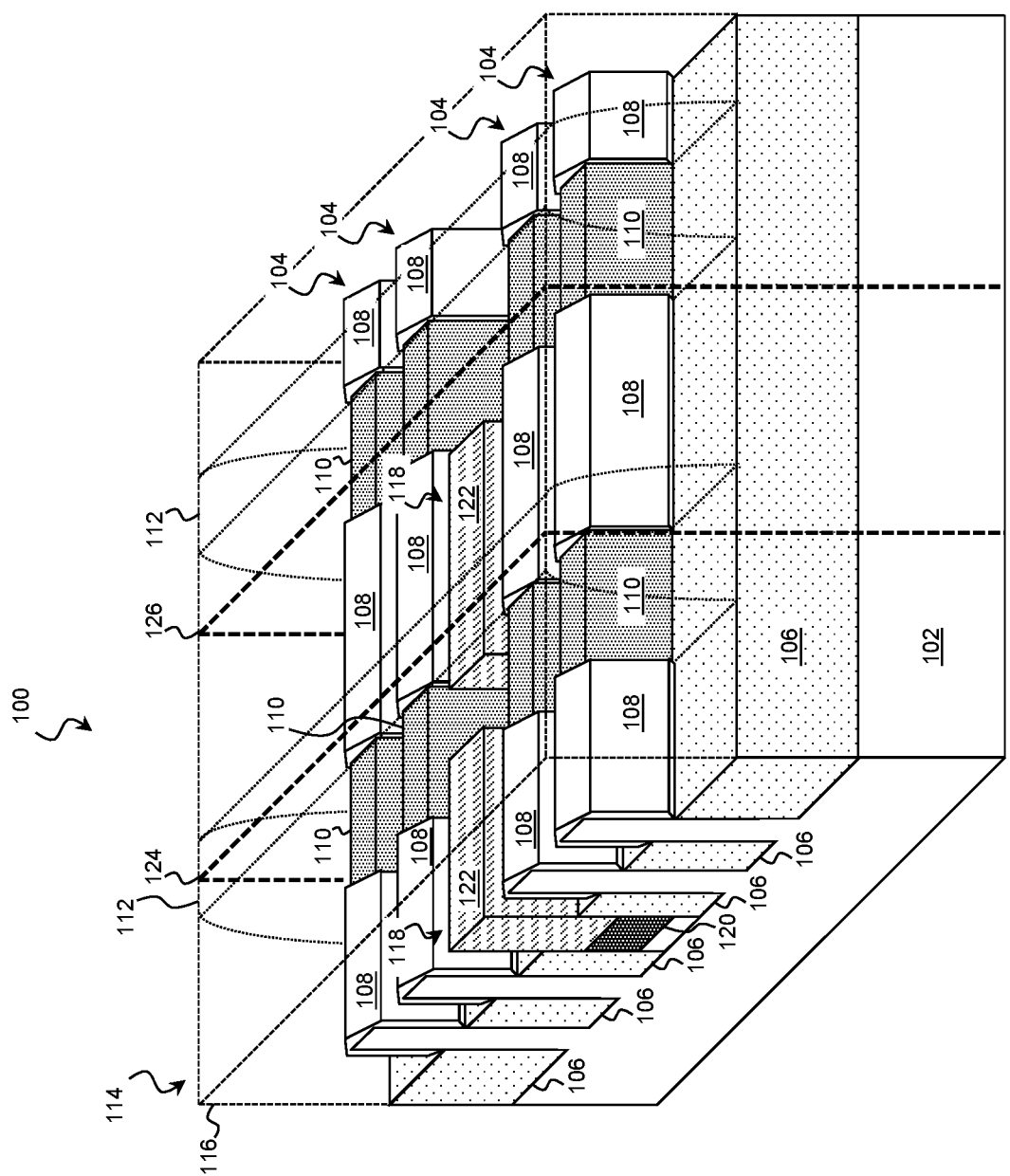
FIG. 1 is a perspective view of a portion of a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As device sizes continue to fall, a circuit may become wire-bound. In other words, the circuit size may depend more on the conductive lines in an interconnect structure that electrically couples the circuit devices than on the sizes of the devices themselves. While the thickness of the conductive lines may be reduced to pack more lines in the interconnect, thinner lines have a higher resistance, making them slower and more of a load on the driving device. Likewise, reducing the spacing between lines increases the risk of shorts, noise interference, and capacitive coupling, which may increase the load on the driver. Additional layers of conductive lines may be added to the interconnect structure, but routing on these layers may take additional vias, which have an associated resistance and pose inter-layer alignment issues. Alignment errors tend to compound with each additional interconnect layer, adding yield risk as the number of layers grows.

As described below, the present disclosure provides a technique to relieve some interconnect congestion by providing conductive lines below the interconnect (e.g., the conductive lines and vias above the circuit devices and the contacts that couple to the devices). For example, in a FinFET circuit, an interconnect line may be buried in a dummy fin among the device fins. The buried interconnect line provides an additional routing resource for coupling the FinFETs and other circuit device. Thus, some embodiments of the present disclosure thereby provide additional routing resources to relieve routing congestion in the interconnect structure. However, unless otherwise noted, no embodiment is required to provide any particular advantage.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 with one or more device fins 104 formed upon it and separated by isolation features 106. The device fins 104 are representative of any raised feature, and while the illustrated embodiments include FinFET device fins 104, further embodiments include other raised active and passive devices formed upon the substrate 102. In some embodiments, the FinFET device fins 104 include a pair of opposing source/drain features 108 separated by a channel region 110. The flow of carriers (electrons for an n-channel FinFET and holes for a p-channel FinFET) through the channel region 110 is controlled by a voltage applied to a gate stack 112 adjacent to and overwrapping the channel region 110. The gate stack 112 is shown as translucent to better illustrate the underlying channel region 110.

In the illustrated embodiment, the channel region 110 rises above the plane of the substrate 102 upon which it is formed and above the isolation features 106, and accordingly, circuit devices formed on the device fins 104 may be referred to as a "nonplanar" devices. The raised channel region 110 provides a larger surface area proximate to the gate stack 112 than comparable planar devices. This strengthens the electromagnetic field interactions between the gate stack 112 and the channel region 110, which may reduce leakage and short channel effects associated with smaller devices. Thus in many embodiments, FinFETs, and other nonplanar devices deliver better performance in a smaller footprint than their planar counterparts.

The workpiece 100 may include a Multi-Layer Interconnect (MLI) structure 114 to electrically couple the devices of the device fins 104 and other circuit devices. Each layer of the MLI structure 114 may include conductive elements (e.g., lines, vias, contacts, gate stacks, etc.) disposed in an Inter-Level Dielectric (ILD) 116 that supports and isolates these elements. The lower layers of the MLI structure 114 may include the gate stack 112 and source/drain contacts disposed in the ILD 116. In the upper layers, MLI structure 114 may contain conductive lines and vias disposed in the ILD. For clarity, in FIG. 1, only the lowest layer of the MLI structure 114 is shown, and the ILD 116 is shown as translucent. Latter figures illustrate additional layers of the MLI structure 114.

In some examples, the size and density of the workpiece 100 is limited by the density of the conductive lines within the MLI structure 114. To address this, some of the fins (e.g., dummy fin 118) may include an interconnect line 120 buried below the top of the isolation features 106. The buried interconnect line 120 may relieve some of the routing congestion in the MLI structure 114, and because it is proximate to the device fins 104, the buried interconnect line 120 may be coupled directly to the source/drain features 108 and/or the gate stacks 112 without any intervening vias. As can be seen, the dummy fins 118 may be different in length from the device fins 104. Selectively forming a dummy fins 118 where the buried interconnect line 120 is used to route a signal and not extending the dummy fin 118 elsewhere may reduce the capacitance associated with surplus conductive material.

The sides of the buried interconnect line 120 may be covered and electrically isolated by the isolation features 106, and the top of the interconnect line 120 may be covered and electrically isolated by a dummy fin dielectric 122 disposed on the interconnect line 120. In some examples, the dummy fin dielectric 122 extends between the isolation features 106 to cover the top of the interconnect line 120. The dummy fin dielectric 122 may be patterned to expose the buried interconnect line 120 adjacent the channel regions 110, the source/drain features 108, and/or elsewhere to allow coupling to the interconnect line 120. In some examples, the dummy fin dielectric 122 is patterned to allow a gate stack 112 or a source/drain contact to electrically couple directly to the interconnect line 120.

Exemplary methods of forming a workpiece with a buried interconnect line 120, such as the workpiece 100 of FIG. 1, will now be described with reference to FIGS. 2A-21B. Some of the figures that follow refer to cross-sections taken through the channel region 110 (e.g., along plane 124) and/or through the source/drain features 108 (e.g., along plane 126) of the device fins 104. For reference, these cross-sectional planes 124 and 126 are shown in FIG. 1.

Figure 2A:
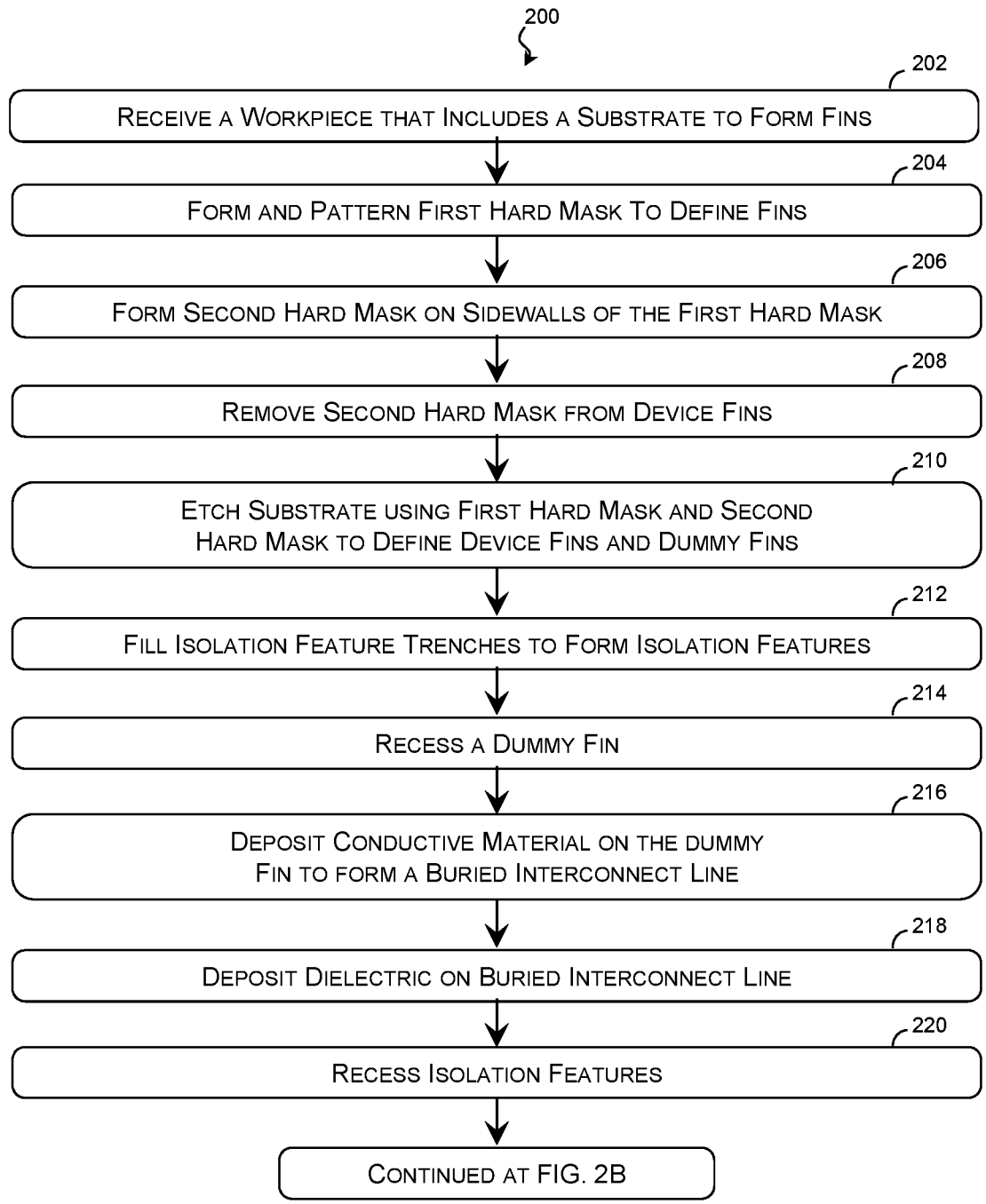
FIGS. 2A and 2B are flow diagrams of a method of fabricating a workpiece with a buried interconnect line according to various aspects of the present disclosure.
Figure 2B:
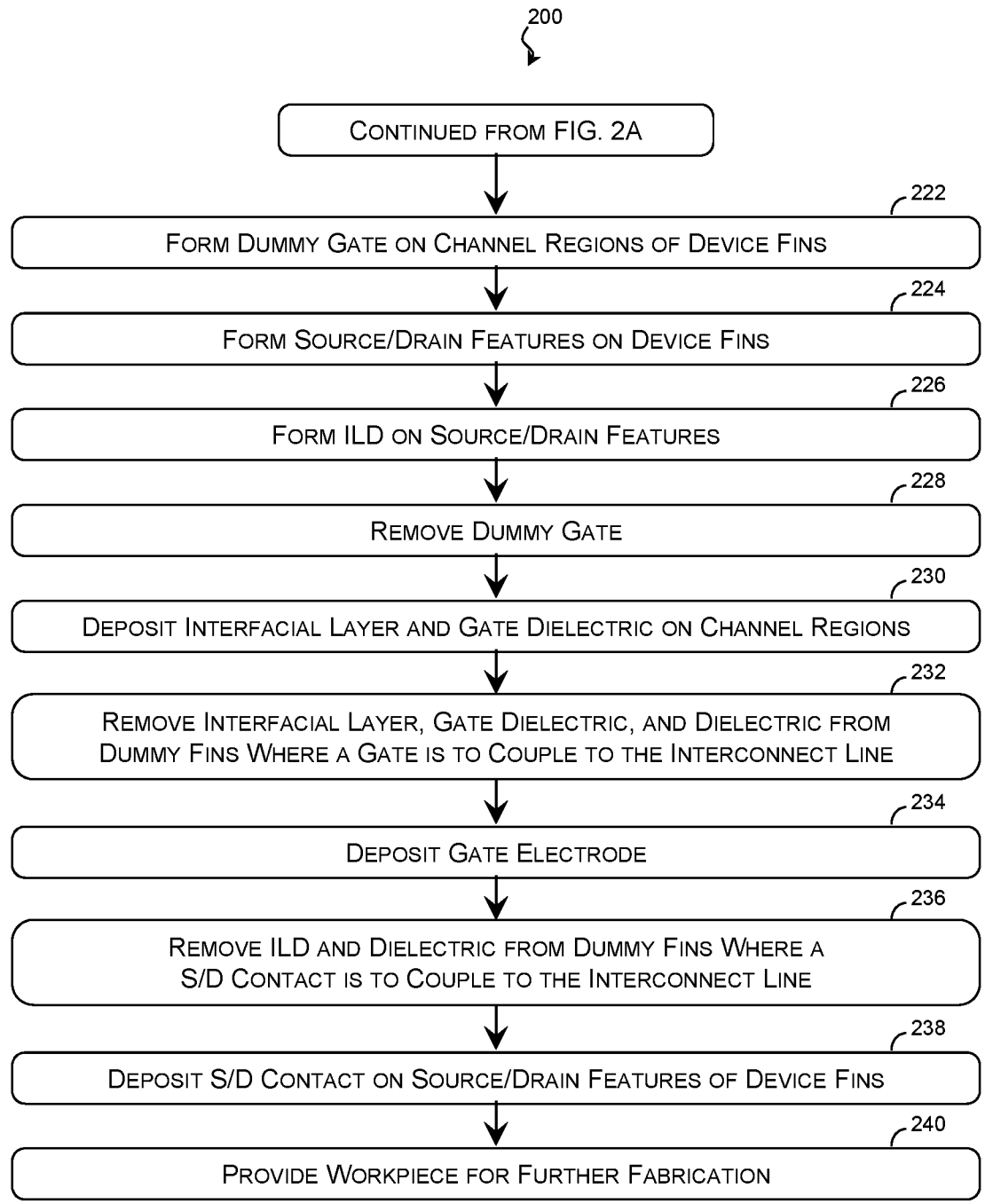
Figure 3A:
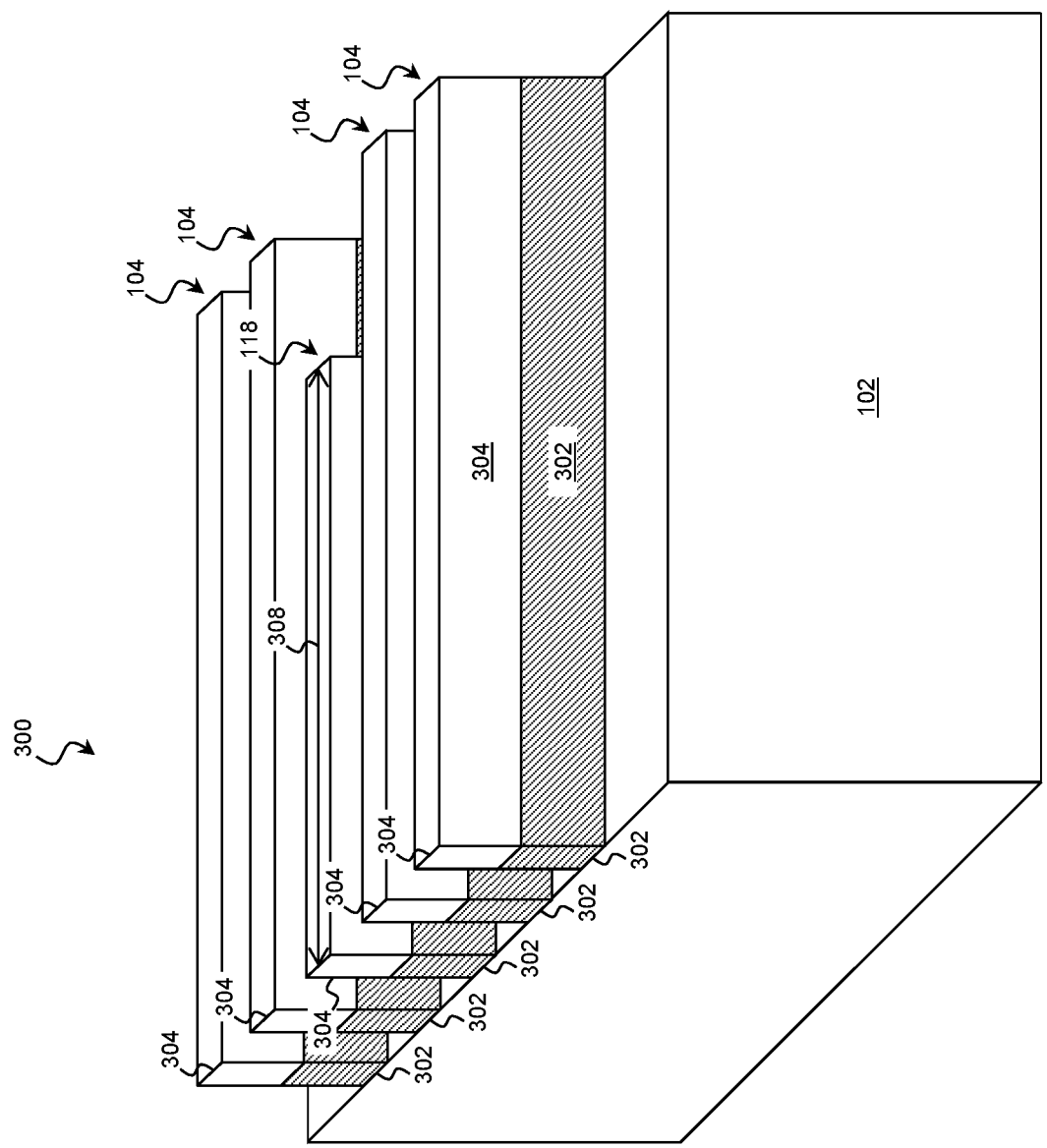
FIG. 3A is a perspective view of the workpiece at a stage of the method of fabricating the workpiece with a buried interconnect line according to various aspects of the present disclosure.
Figure 17C:
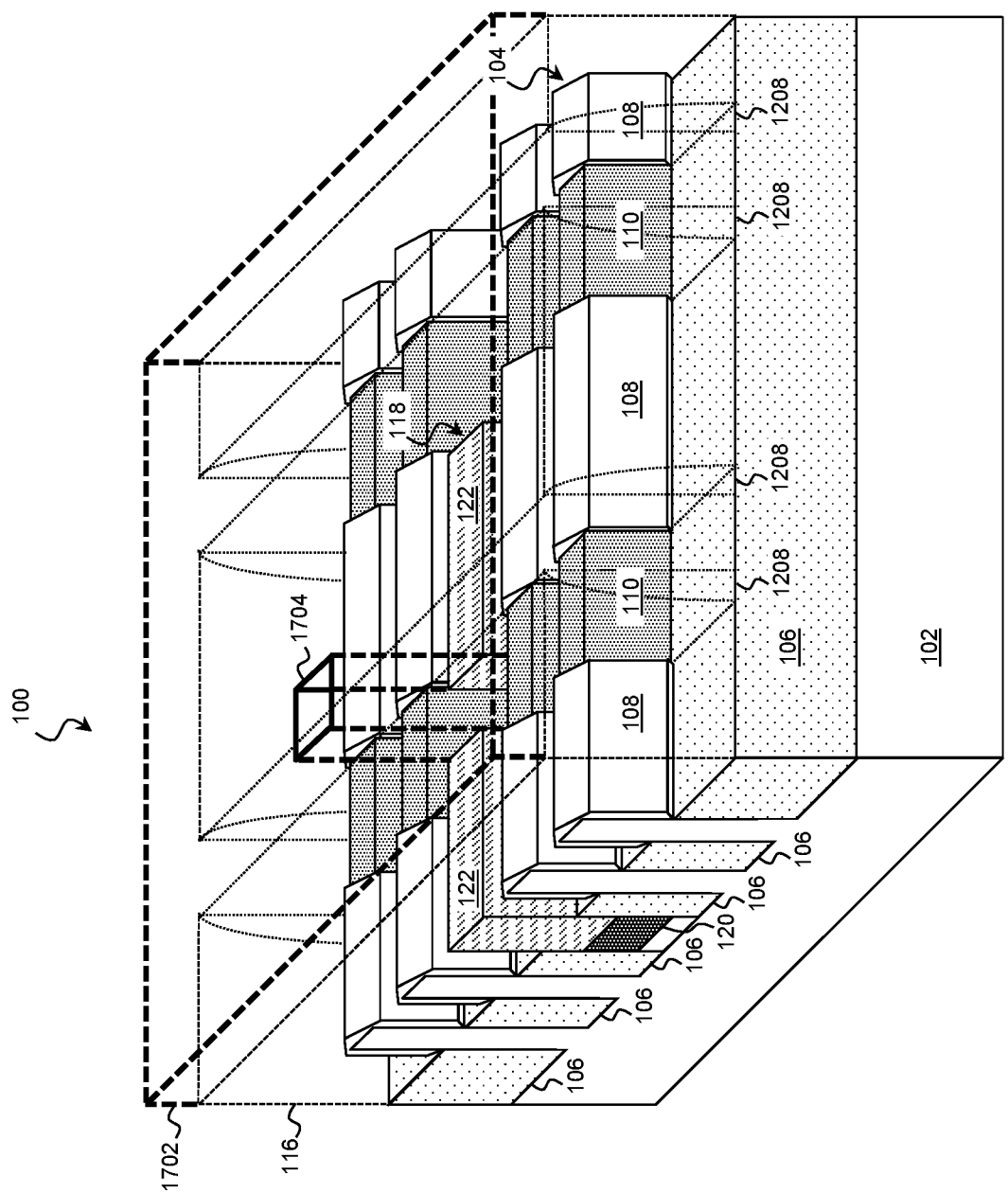
FIG. 17C is a perspective view of the workpiece at a stage of the method of fabricating the workpiece with the buried interconnect line according to various aspects of the present disclosure

FIGS. 2A and 2B are flow diagrams of a method 200 of fabricating a workpiece 300 with a buried interconnect line according to various aspects of the present disclosure. The workpiece 300 may be substantially similar to the workpiece 100 of FIG. 1 in many regards. Additional steps can be provided before, during, and after the method 200, and some of the steps described can be replaced or eliminated for other embodiments of the method 200. FIGS. 3A and 12 are perspective view diagrams of the workpiece 300 at various stages of the method 200 of fabricating a workpiece 300 with a buried interconnect line according to various aspects of the present disclosure. FIGS. 3B, 4-11, 13A, 14A, 15A, 16A, 17A, 18A, 19A, 20A, and 21A are cross-sectional diagrams taken along a channel region 110 of the workpiece 300 at various stages of the method 200 of fabricating a workpiece 300 with a buried interconnect line according to various aspects of the present disclosure. Throughout the corresponding processes of blocks 202-220, the source/drain features 108 and the channel regions 110 may undergo substantially similar processes. To avoid unnecessary duplication, the substantially similar cross-sectional views showing a cross section taken along the source/drain features 108 are omitted. However, where the regions may differ, both channel region 110 and source/drain feature 108 cross-sections are provided. In that regard, FIGS. 13B, 14B, 15B, 16B, 17B, 18B, 19B, 20B, and 21B are cross-sectional diagrams of the workpiece 300 taken along a source/drain feature 108 at various stages of the method 200 of fabricating a workpiece 300 with a buried interconnect line according to various aspects of the present disclosure. Additionally, FIG. 17C is a perspective view of the workpiece 300 at a stage of the method 200 of fabricating a workpiece 300 with a buried interconnect line according to various aspects of the present disclosure.

Referring first to block 202 of FIG. 2A and to FIGS. 3A and 3B, a workpiece 300 is received that includes a substrate 102 upon which fins are to be formed. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 102 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a semiconductor oxide, a semiconductor nitride, a semiconductor oxynitride, a semiconductor carbide, and/or other suitable insulator materials.

Referring to block 204 of FIG. 2A and referring still to FIGS. 3A and 3B, a first hard mask 302 is formed on the substrate 102 and patterned to define the device fins 104 and dummy fins 118 to be formed in subsequent processes. The first hard mask 302 may include a dielectric such as a semiconductor oxide, a semiconductor nitride, a semiconductor oxynitride, and/or a semiconductor carbide, and in an exemplary embodiment, the first hard mask 302 includes silicon nitride. The first hard mask 302 may be formed to any suitable thickness and by any suitable process including thermal growth, chemical vapor deposition (CVD), high-density plasma CVD (HDP-CVD), physical vapor deposition (PVD), atomic-layer deposition (ALD), and/or other suitable deposition processes.

To pattern the first hard mask 302, a first photoresist 304 may be formed on the first hard mask 302. An exemplary first photoresist 304 includes a photosensitive material sensitive to radiation such as UV light, deep ultraviolet (DUV) radiation, and/or EUV radiation. A lithographic exposure is performed on the workpiece 300 that exposes selected regions of the first photoresist 304 to radiation. The exposure causes a chemical reaction to occur in the exposed regions of the first photoresist 304. After exposure, a developer is applied to the first photoresist 304. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene.

After the first photoresist 304 is developed, the first hard mask 302 may be patterned by an etching process that removes portions of the first hard mask 302 exposed by the first photoresist 304. In various examples, etching is performed by wet etching, dry etching, Reactive Ion Etching (RIE), ashing, and/or other etching methods using etchant chemistries such as carbon tetrafluoride ($CF_4$), difluoromethane ($CH_2F_2$), trifluoromethane ($CHF_3$), other suitable etchants, and/or combinations thereof. After etching the first hard mask 302, the first photoresist 304 may be removed.

In the illustrated examples, the first hard mask 302 defines four device fins 104 and one dummy fin 118 of uniform width as indicated by markers 306, although in further examples, the first hard mask 302 may define any number of device fins 104 and dummy fins 118 of any suitable width.

The device fins 104 and the dummy fins 118 may extend to any length 308, and in many examples, the dummy fins 118 and the resulting buried interconnect are shorter in length than the device fins 104. The spacing between fins may be uniform or may vary, and in some embodiments, the dummy fin 118 has additional spacing and subsequent processes enlarge the width of the fin to lower the resistance of a buried interconnect line as shown in blocks 206-208.

Referring to block 206 of FIG. 2A and to FIG. 4, a second hard mask 402 is formed on at least the sidewalls of the first hard mask 302. The second hard mask 402 may include any suitable material (e.g., semiconductor, semiconductor oxide, semiconductor nitride, semiconductor oxynitride, semiconductor carbide, etc.), and may be selected to have a different etchant selectivity than the first hard mask 302. In an example, the first hard mask 302 includes silicon nitride, and the second hard mask 402 includes amorphous silicon.

The second hard mask 402 may be deposited by any suitable process including CVD, HDP-CVD, ALD, PVD, and/or other suitable deposition techniques. In some such embodiments, the material of the second hard mask 402 is deposited conformally by CVD or ALD and an anisotropic (directional) etching technique such, as an anisotropic plasma etching, is performed to remove portions of the second hard mask 402 deposited on horizontal surfaces of the substrate 102. In this way, portions of the second hard mask 402 deposited on the vertical surfaces of the first hard mask 302 remain. In some examples, the second hard mask 402 remains on the horizontal surfaces of the first hard mask 302. In further examples, etching the second hard mask 402 from the horizontal surfaces of the substrate 102 also removes the second hard mask 402 from the horizontal surfaces of the first hard mask 302.

The second hard mask 402 may be used to widen the dummy fin 118 relative to the device fins 104 by removing it from the device fins 104. Referring to block 208 of FIG. 2A and to FIGS. 5 and 6, the second hard mask 402 is selectively removed from portions of the first hard mask 302 corresponding to device fins 104 while being preserved on the portion of the first hard mask 302 corresponding to the dummy fin 118. In an example, a second photoresist 502 is formed on the first hard mask 302 and the second hard mask 402 as shown in FIG. 5. In many regards, the second photoresist 502 may be substantially similar to the first photoresist 304, and a similar lithographic exposure may be performed on the workpiece 300 to expose selected regions of the second photoresist 502 to radiation. After exposure, a developer is applied to the second photoresist 502 to remove the second photoresist 502 from over the first hard mask 302 features that define device fins 104 while leaving the second photoresist 502 over the first hard mask 302 features that define the dummy fin 118.

Referring to FIG. 6, after the second photoresist 502 is developed, the exposed portions of the second hard mask 402 may be removed by an etching process, such as wet etching, dry etching, Reactive Ion Etching (RIE), ashing, and/or other etching methods. In an example, the etching process includes an ammonia dip to remove amorphous silicon of the second hard mask 402. After etching, the second photoresist 502 may be removed.

Figure 7:
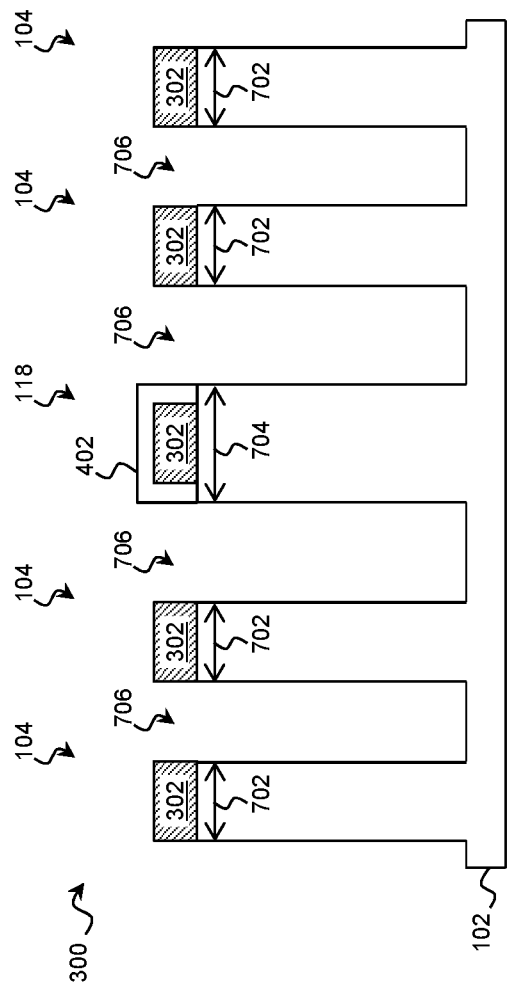
Figure 8:
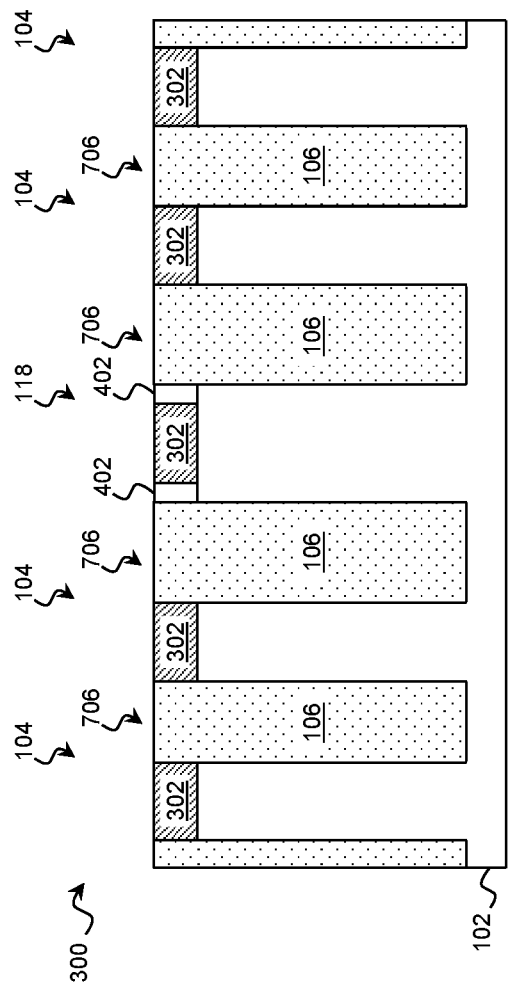

Referring to block 210 of FIG. 2A and to FIG. 7, the substrate 102 is etched using the first hard mask 302 and the second hard mask 402 to define the device fins 104 and the dummy fin 118. The etching processes may include any suitable etching technique such as wet etching, dry etching, RIE, ashing, and/or other etching methods. In some embodiments, etching includes multiple etching steps with different etching chemistries, each targeting a particular material of the substrate 102 and each selected to resist etching the first hard mask 302 and the second hard mask 402. For example, in an embodiment, the substrate 102 is etched by a dry etching process using a fluorine-based etchant (e.g., $CF_4$, $CHF_3$, $CH_2F_2$, etc.).

The etching is configured to produce device fins 104 and dummy fins 118 of any suitable height and width extending above the reminder of the substrate 102. In some examples, the processes of blocks 206-208 result in a dummy device fin 104 that is wider than the device fins 104 as indicated by markers 702 and 704. The wider dummy device fin 104 may produce a wider buried interconnect line with lower resistance and reduced risk of discontinuities.

In addition to defining the device fins 104 and dummy fins 118, the etching of block 210 may also define one or more isolation feature trenches 706 between the device fins 104 and dummy fins 118. Referring to block 212 of FIG. 2A and to FIG. 8, the isolation feature trenches 706 are filled with a dielectric material to form an isolation feature 106, such as a shallow trench isolation feature (STI). Suitable dielectric materials for the isolation features 106 include semiconductor oxides, semiconductor nitrides, semiconductor carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. In one such embodiment, a CVD process is used to deposit a flowable dielectric material that includes both a dielectric component and a solvent in a liquid or semiliquid state. A curing process is used to drive off the solvent, leaving behind the dielectric material of the isolation features 106 in its solid state. Following the deposition, a Chemical Mechanical Polishing/Planarization (CMP) process may be performed to remove excess dielectric material.

Referring to block 214 of FIG. 2A and to FIG. 9, a portion of the dummy fin 118 may be removed. This may create a recess between the isolation features 106 for the buried interconnect line. In some examples, the patterning of block 214 leaves a portion of the substrate 102 remaining between the isolation features 106 having any suitable height (as indicated by marker 902). However, in some examples, the patterning completely removes the substrate 102 of the dummy fin 118 between the isolation features 106.

The dummy fin 118 may be selectively removed using any suitable technique. In an embodiment, a third photoresist 904 is formed on the workpiece 300. In many regards, the third photoresist 904 may be substantially similar to the first photoresist 304 and/or the second photoresist 502, and a similar lithographic exposure may be performed on the workpiece 300 to expose selected regions of the third photoresist 904 to radiation. After exposure, a developer is applied to the third photoresist 904 to remove the third photoresist 904 from over the dummy fin 118. After the third photoresist 904 is developed, exposed portions of the first hard mask 302, second hard mask 402, and the substrate 102 may be removed by an etching process, such as wet etching, dry etching, RIE, ashing, and/or other etching methods. In some embodiments, etching includes multiple etching steps with different etching chemistries, each targeting a particular material of the first hard mask 302, the second hard mask 402, and the substrate 102 while resisting etching of the third photoresist 904 and the isolation features 106. By selecting an etchant that resists etching the isolation features, in some embodiments, portions of the isolation features 106 adjacent to the dummy fin 118 are exposed without consequence. This may increase the tolerance of the photolithographic process. The third photoresist 904 may be removed after the etching process completes.

Referring to block 216 of FIG. 2A and to FIG. 10, a conductive material is deposited on the substrate 102 of the dummy fin 118 between the isolation features 106 to form the buried interconnect line 120. The buried interconnect line 120 may include any suitable conductive material deposited by any suitable technique such as CVD, HDP-CVD, PVD, ALD, and/or other suitable techniques. In some examples, the buried interconnect line 120 includes tungsten, a tungsten alloy, ruthenium, $RuO_2$, and/or other ruthenium compounds deposited by CVD. Tungsten and ruthenium may be used because of their resilience to diffusion during high temperature processes. Other suitable materials for the buried interconnect line 120 include Ti, TiN, polysilicon, and/or a Cu-containing fill material with a tungsten-, titanium-, or ruthenium-containing liner. The conductive material may be deposited to any suitable thickness. In various examples, the resulting interconnect line 120 has a height 1002 in a vertical direction of between about 10 nm and about 30 nm, has a width 1004 in a horizontal direction of between about 8 nm and about 16 nm, and the top of the interconnect line 120 is between about 10 nm and about 30 nm below a top surface of the isolation features 106. In such examples, the interconnect line 120 has an aspect ratio (width:height) of between about 1:4 and about 3:2.

Referring to block 218 of FIG. 2A and to referring still to FIG. 10, a dummy fin dielectric 122 may be deposited on the buried interconnect line 120. The dummy fin dielectric 122 may include any suitable dielectric material including a semiconductor oxide, a semiconductor nitride, a semiconductor oxynitride, a semiconductor carbide, and/or other suitable dielectric materials, and may be deposited by any suitable deposition process including thermal growth, CVD, HDP-CVD, PVD, ALD, and/or other suitable processes. In an example, the dummy fin dielectric 122 includes silicon carbon nitride (SiCN) deposited by CVD. Following the deposition, a CMP process may be performed to remove excess dielectric material.

Figure 11:
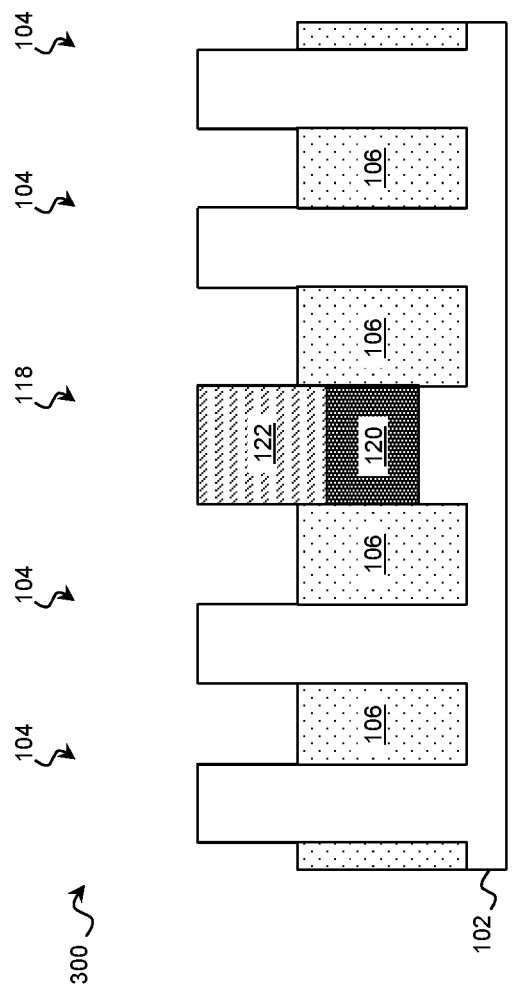
Figure 12:
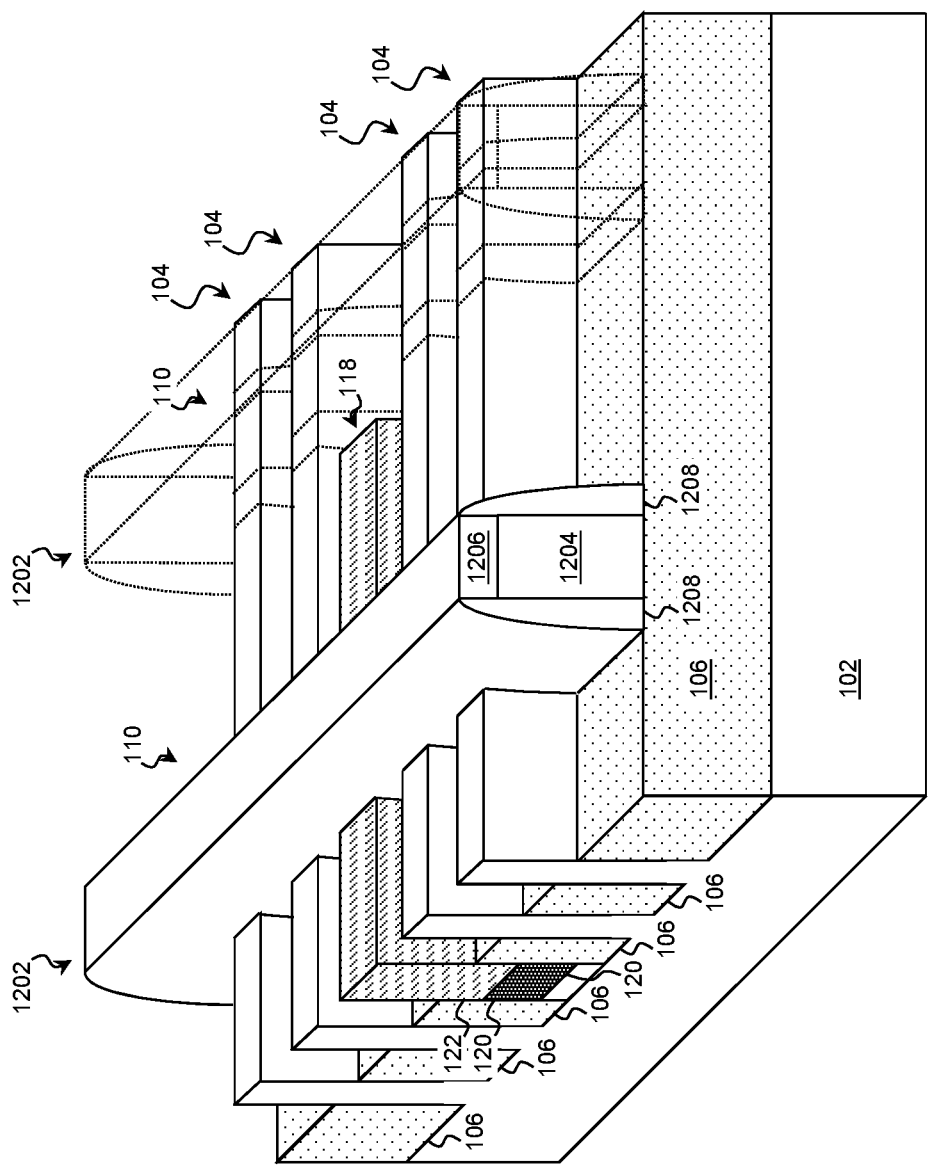
FIG. 12 is a perspective view of the workpiece at a stage of the method of fabricating the workpiece with a buried interconnect line according to various aspects of the present disclosure.

Referring to block 220 of FIG. 2A and referring to FIG. 11, the isolation features 106 are recessed. Any suitable etching technique may be used to recess the isolation features 106 including dry etching, wet etching, RIE, and/or other etching methods, and in an exemplary embodiment, an anisotropic dry etching is used to selectively remove the dielectric material of the isolation features 106 without etching the substrate 102. The remainder of the first hard mask 302 and the second hard mask 402 may also be removed before, during, and/or after the recessing of the isolation features 106. In some examples, the first hard mask 302 and second hard mask 402 are removed by a CMP process performed prior to the recessing of the isolation features 106. In some examples, the first hard mask 302 and second hard mask 402 are removed by an etchant used to recess the isolation features 106.

A dummy gate may then be formed over a channel region 110 of the device fins 104. Referring to block 222 of FIG. 2B and referring to FIG. 12, a dummy gate 1202 is formed on the channel region 110. In FIG. 12, one dummy gate 1202 is shown as translucent to better illustrate the underlying channel region 110. The dummy gate 1202 may reserve an area for a metal gate stack and may include a dummy gate layer 1204, a dummy gate hard mask 1206, gate spacers 1208, and/or other components. Accordingly, in some embodiments, forming the dummy gate 1202 includes depositing the dummy gate layer 1204 containing polysilicon or other suitable material and patterning the dummy gate layer 1204 in a lithographic process. Thereafter, the dummy gate hard mask 1206 is formed on the dummy gate layer 1204. The dummy gate hard mask 1206 may include any suitable material, such as a semiconductor oxide, a semiconductor nitride, a semiconductor carbide, a semiconductor oxynitride, other suitable materials, and/or combinations thereof.

In some embodiments, gate spacers 1208 are formed on each side of the dummy gate (on the sidewalls of the dummy gate layer 1204 and/or dummy gate hard mask 1206). The gate spacers 1208 may be used to offset the subsequently formed source/drain features and may be used for designing or modifying the source/drain structure (junction) profile. The gate spacers 1208 may include any suitable dielectric material, such as a semiconductor oxide, a semiconductor nitride, a semiconductor carbide, a semiconductor oxynitride, other suitable materials, and/or combinations thereof.

Referring to block 224 of FIG. 2B and to FIGS. 13A and 13B, an epitaxial process is performed to form source/drain features 108 on the substrate 102 in the source/drain regions of the device fins 104. The dummy gate and/or gate spacers 1208 limit the source/drain features 108 to the source/drain regions. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 102.

The source/drain features 108 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 108 are not in-situ doped, an implantation process (i.e., a junction implant process) is performed to dope the source/drain features 108. In an exemplary embodiment, the source/drain features 108 in an NMOS device include SiP, while those in a PMOS device include GeSnB (tin may be used to tune the lattice constant) and/or SiGeSnB. One or more annealing processes may be performed to activate the source/drain features 108. Suitable annealing processes include rapid thermal annealing (RTA) and/or laser annealing processes.

Figure 14A:
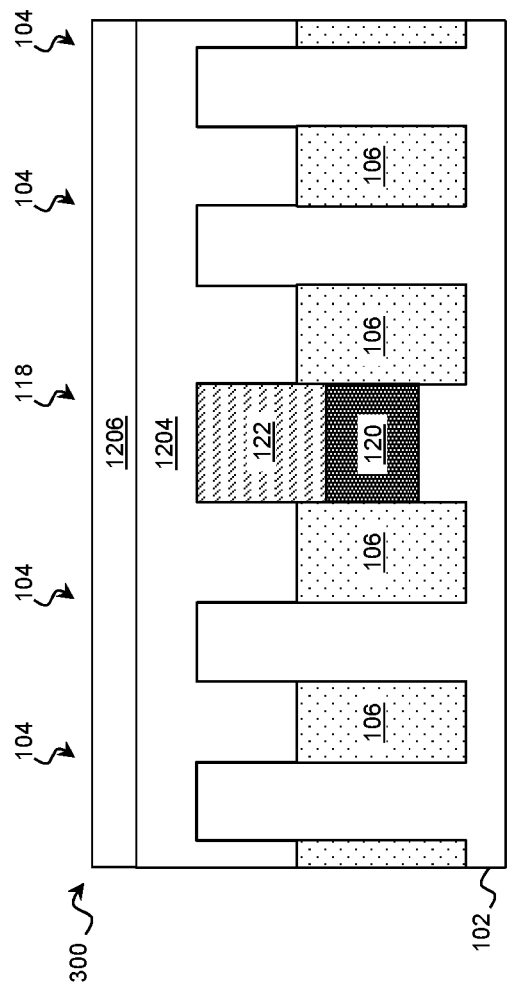
Figure 14B:
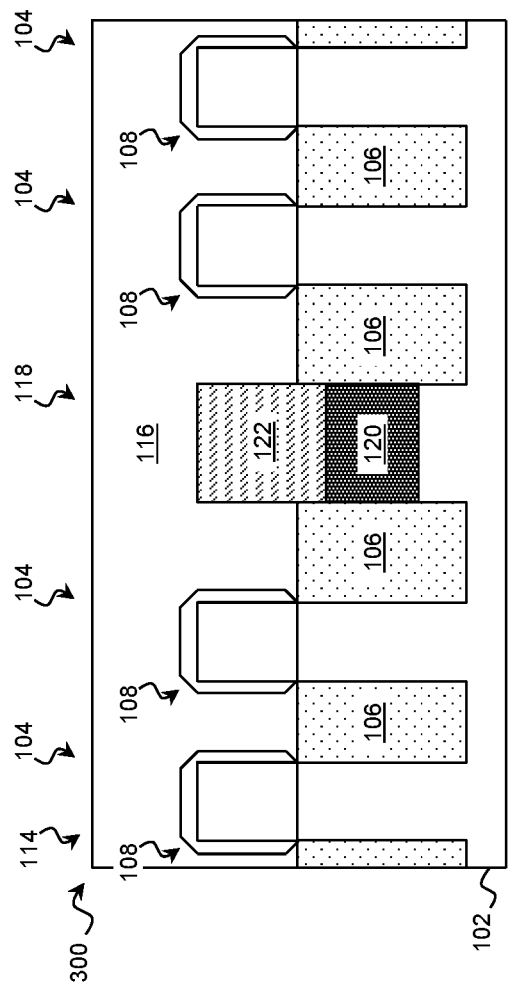

Referring to block 226 of FIG. 2B and to FIGS. 14A and 14B, an Inter-Level Dielectric (ILD) 116 is formed on the source/drain features 108 in the source/drain regions. The ILD 116 may be part of an electrical MLI structure 114 that electrically interconnects the devices of the workpiece including the FinFET devices formed on the device fins 104. In such embodiments, the ILD 116 acts as an insulator that supports and isolates conductive traces of the MLI structure 114. The ILD 116 may comprise any suitable dielectric material, such as a semiconductor oxide, a semiconductor nitride, a semiconductor oxynitride, a semiconductor carbide, other suitable materials, and/or combinations thereof.

The ILD 116 may surround the dummy gate 1202 allowing it to be removed and a replacement gate to be formed in the resulting cavity. Accordingly, in such embodiments, the dummy gate layer 1204 and dummy gate hard mask 1206 are removed after depositing the ILD 116 as shown in block 228 of FIG. 2B and FIGS. 15A and 15B.

A gate stack 112 is formed on the workpiece 100 wrapping around the channel regions 110 of the device fins 104. Although it is understood that the gate stack 112 may be any suitable gate structure, in some embodiments, the gate stack 112 is a high-k metal gate that includes an interfacial layer 1602, a gate dielectric layer 1604, and a gate electrode 1802 that may each comprise a number of sub-layers.

Referring to block 230 of FIG. 2B and to FIGS. 16A and 16B, in some such embodiments, the interfacial layer 1602 is deposited on the workpiece 300 and the gate dielectric layer 1604 is deposited on the interfacial layer 1602. With respect to the interfacial layer 1602, it may be deposited by any suitable technique, such as ALD, CVD, ozone oxidation, etc. The interfacial layer 1602 may include a metal silicate (e.g., HfSiO), a metal or semiconductor oxide, a metal or semiconductor nitride, a metal or semiconductor oxynitride, and/or other suitable material. Likewise, the gate dielectric layer 1604 is deposited on the interfacial layer 1602 by any suitable technique, such as ALD, CVD, metal-organic CVD (MOCVD), PVD, thermal oxidation, combinations thereof, and/or other suitable techniques. A high-k-type gate dielectric layer 1604 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials.

Some gate stacks 112 may electrically couple directly to the buried interconnect line 120. Referring to block 232 of FIG. 2B and to FIGS. 17A, 17B, and 17C, the interfacial layer 1602, gate dielectric layer 1604, and dummy fin dielectric 122 may be removed to expose the buried interconnect line 120 in those locations on the workpiece 300 where a gate stack 112 is to electrically couple to the buried interconnect line 120. In an example, a fourth photoresist 1702 is formed on the workpiece 300, and a lithographic exposure is performed that exposes selected regions of the fourth photoresist 1702 to radiation. After exposure, a developer is applied to the fourth photoresist 1702 to remove the portions of the fourth photoresist 1702 from over the dummy fin dielectric 122 in locations where a gate stack 112 is to couple to the buried interconnect line 120. Referring to FIG. 17C, a recess in the patterned fourth photoresist 1702 is indicated by marker 1704.

After the fourth photoresist 1702 is developed, exposed portions of the interfacial layer 1602, gate dielectric layer 1604, and the dummy fin dielectric 122 may be removed by an etching process, such as wet etching, dry etching, RIE, ashing, and/or other etching methods. In various examples, the etching process includes one or more anisotropic (directional) etching processes configured to etch faster in a vertical direction than a horizontal direction using one or more etchants configured to selectively etch the interfacial layer 1602, the gate dielectric layer 1604, and the dummy fin dielectric 122. The fourth photoresist 1702 may be removed after the etching process completes.

Referring to block 234 of FIG. 2B and to FIGS. 18A and 18B, a gate electrode 1802 is deposited on the channel regions 110 of the workpiece. In particular, the gate electrode 1802 may be deposited on the interfacial layer 1602 and the gate dielectric layer 1604 and may be electrically coupled to the buried interconnect line 120 in regions where the interfacial layer 1602 and the gate dielectric layer 1604 have been removed. In various examples, the gate electrode 1802 is formed by ALD, PVD, CVD, or other suitable process, and may include a single layer or multiple layers, such as a metal layer, a liner layer, a wetting layer, and/or an adhesion layer. The gate electrode 1802 may include Ti, Ag, Al, TiAlN, TaC, TaCN, TaSiN, Mn, Zr, TiN, TaN, Ru, Mo, Al, WN, Cu, W, and/or any other suitable materials. In some embodiments, different metal gate materials are used for nMOS and pMOS devices. A CMP process may be performed to produce a substantially planar top surface of the gate stack 112.

Figure 21A:
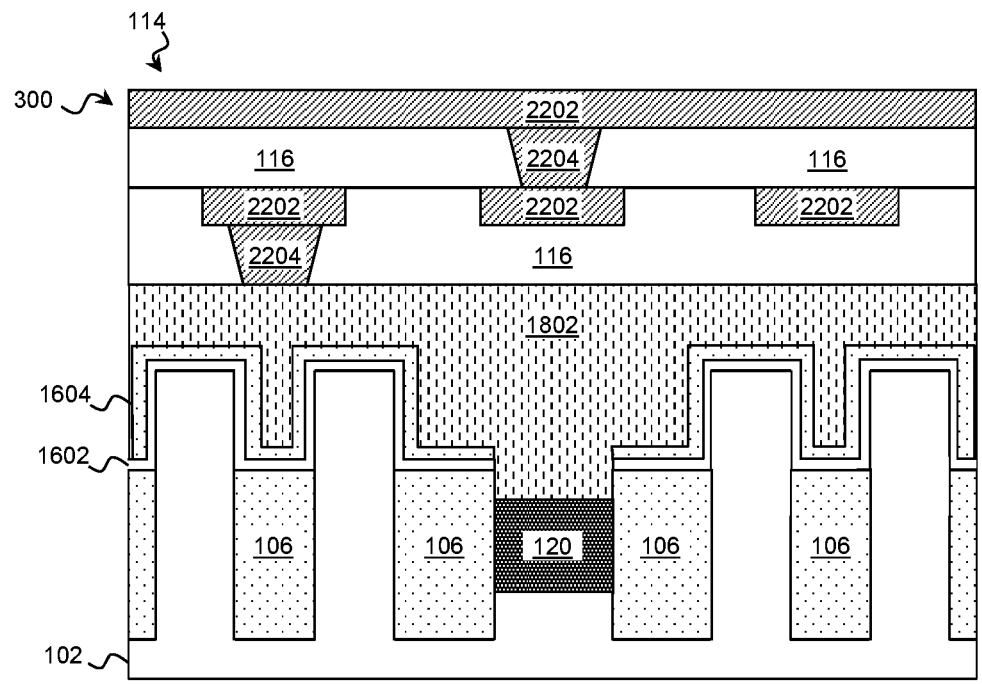
Figure 21B:
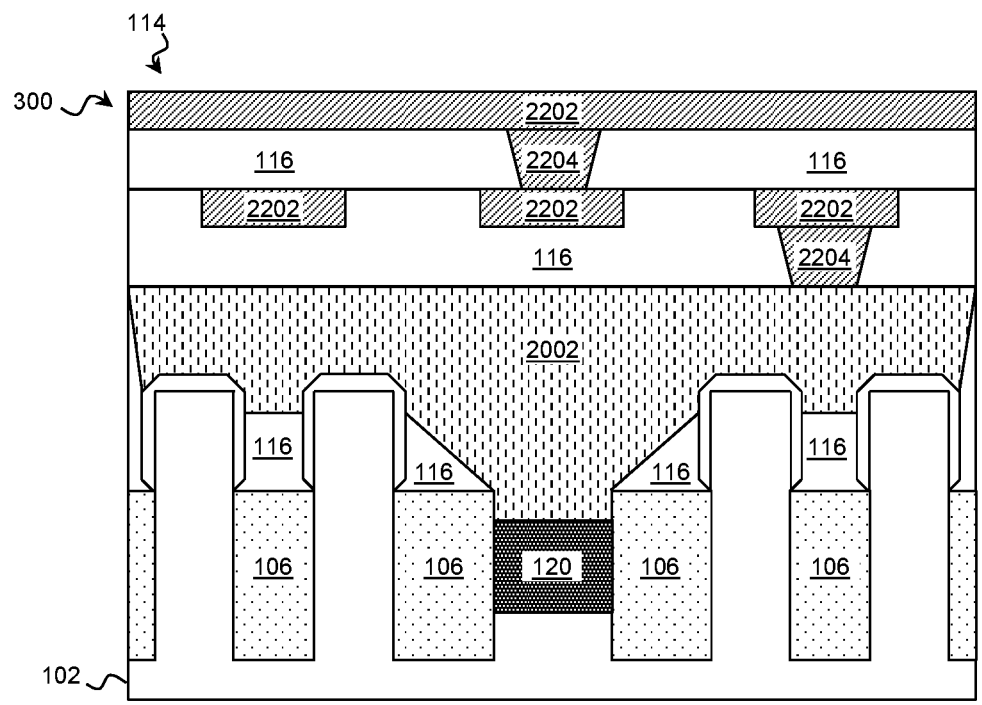

At any time before, during, or after forming the gate stacks 112, contacts and vias to the source/drain features 108 may be formed. Some of the source/drain contacts may extend to and electrically couple to the buried interconnect line 120. In this way, those source/drain contacts that extend to the buried interconnect line 120 may electrically couple the respective source/drain features 108 to other source/drain features 108 and/or to gate stacks 112 based on the circuit design being implemented. In regions where such contacts are not to be formed, the cross-sectional view through the source/drain region 108 (e.g., along plane 126 or a parallel plane that extends through another source/drain region 108) may remain as shown in FIG. 18B, for example. In contrast, examples of forming source/drain contacts that couple to a buried interconnect line 120 are described with reference to FIGS. 19A-21B, of which FIGS. 19A, 20A, and 21A are cross-sections taken through a channel region 110 (e.g., along plane 124) and FIGS. 19B, 20B, and 21B are cross-sections taken through a source drain feature 108 (e.g., along plane 126 or a parallel plane that extends through another source/drain region 108). Referring to block 236 of FIG. 2B and to FIGS. 19A and 19B, the ILD 116 and dummy fin dielectric 122 may be removed to expose the buried interconnect line 120 in those locations on the workpiece 300 where a source/drain contact is to electrically couple to the buried interconnect line 120. In an example, a fifth photoresist 1902 is formed on the workpiece 300, and a lithographic exposure is performed that exposes selected regions of the fifth photoresist 1902 to radiation. After exposure, a developer is applied to the fifth photoresist 1902 to remove the portions of the fifth photoresist 1902 from over the ILD 116 and the dummy fin dielectric 122 in locations where a source/drain contact is to couple to the buried interconnect line 120. After the fifth photoresist 1902 is developed, exposed portions of the ILD 116 and the dummy fin dielectric 122 may be removed by an etching process, such as wet etching, dry etching, RIE, ashing, and/or other etching methods. In various examples, the etching process includes one or more anisotropic (directional) etching processes configured to etch faster in a vertical direction than a horizontal direction using one or more etchants configured to selectively etch the ILD and the dummy fin dielectric 122. In many aspects, a perspective view of the workpiece 300 following the etching of the ILD 116 and the dummy fin dielectric 122 is substantially similar to FIG. 17C. The fifth photoresist 1902 may be removed after the etching process completes.

The etching of block 236 exposes the source/drain features 108 of the device fins 104. Referring to block 238 of FIG. 2B and to FIGS. 20A and 20B, a source/drain contact 2002 is deposited on the source/drain features 108. The contact 2002 may electrically couple the source/drain features 108 to the buried interconnect line 120, and may include one or more layers of conductive materials such as metals (e.g., W, Al, Ta, Ti, Ni, Cu, etc.), metal oxides, metal nitrides, and/or combinations thereof. In some examples, the contact 2002 contains a barrier layer that includes W, Ti, TiN, Ru, and/or combinations thereof and contains a Cu-containing fill material disposed on the barrier layer. In some examples, the contact 2002 includes tungsten, which is deposited with or without a barrier layer. In some examples, the contact includes a cobalt contact material. The material(s) of the contact 2002 may be deposited by any suitable technique including PVD (e.g., sputtering), CVD, PE CVD, ALD, PEALD, and/or combinations thereof. A planarization process can be performed to remove portions of the contact material that is above the ILD 116.

Referring to block 240 of FIG. 2B, and to FIGS. 21A and 21B, the workpiece 300 is provided for further fabrication processes. These processes may include forming additional layers of the MLI structure 114. Each layer may include conductive features, such as interconnect lines 2202 and vias 2204, disposed in additional layers of the ILD 166. In various examples, the interconnect lines 2202 and vias 2204 include a conductive material such as copper, aluminum, aluminum/silicon/copper alloy, titanium, titanium nitride, tungsten nitride, metal silicide, non-metallic conductive material, and/or combinations thereof. In some examples, the interconnect lines 2202 and vias 2204 include a barrier layer, such as a tungsten or tungsten nitride barrier layer, and a fill material such as copper disposed on the barrier layer. The barrier layer may be configured to prevent diffusion of the fill material.

Thus, the present disclosure provides examples of a buried interconnect line for integrated circuit fabrication. In some examples, a device includes a fin disposed on a substrate, and the fin includes an active device. A plurality of isolation features are disposed on the substrate and below the active device. An interconnect is disposed on the substrate and between the plurality of isolation features such that the interconnect is below a topmost surface of the plurality of isolation features. The interconnect is electrically coupled to the active device. In some such examples, a gate stack of the active device is disposed over a channel region of the active device and is electrically coupled to the interconnect. In some such examples, the gate stack is directly electrically coupled to the interconnect. In some such examples, a gate electrode of the gate stack extends between the plurality of isolation features to electrically couple to the interconnect. In some such examples, a source/drain contact is electrically coupled to a source/drain region of the active device and is electrically coupled to the interconnect. In some such examples, the source/drain contact is directly electrically coupled to the interconnect. In some such examples, a horizontal width of the interconnect is greater than a horizontal width of the fin. In some such examples, a ratio of width to height of the interconnect is between about 1:4 and about 3:2. In some such examples, a first side surface of the interconnect is contacted in its entirety by the plurality of isolation features, and a second side surface of the interconnect that is opposite the first side surface is contacted in its entirety by the plurality of isolation features. In some such examples, the interconnect is disposed between the substrate and a dielectric that extends between the plurality of isolation features. In some such examples, a dummy fin portion of the substrate extends between the plurality of isolation features and extends to the interconnect.

In further examples, a device includes a plurality of FinFET devices disposed on a plurality of fins, a plurality of isolation features disposed between the plurality of fins, a conductive line disposed between the plurality of isolation features such that the conductive line is below a topmost surface of the plurality of isolation features and above a bottommost surface of the plurality of isolation features, and a dielectric disposed on the conductive line between the plurality of isolation features. The conductive line is electrically coupled to the plurality of FinFET devices. In some such examples, a gate stack is disposed over channel regions of the plurality of FinFET devices and is electrically coupled to the conductive line. In some such examples, a gate electrode of the gate stack extends between the plurality of isolation features to electrically couple to the conductive line. In some such examples, a source/drain contact is disposed over source/drain features of the plurality of FinFET devices and is electrically coupled to the source/drain features and to the conductive line. In some such examples, the source/drain contact extends between the plurality of isolation features to electrically couple to the conductive line. In some such examples, an inter-level dielectric is disposed over the isolation features, over the conductive line, and between the plurality of FinFET devices. In some such examples, the conductive line has a horizontal width that is greater than a horizontal width of each of the plurality of fins.

In yet further examples, a method includes receiving a substrate; forming on the substrate: a plurality of device fins, a dummy fin, and a plurality of isolation features disposed between the plurality of device fins and the dummy fin; recessing the dummy fin to a height below the plurality of isolation features; and depositing a conductive material on the recessed dummy fin between the plurality of isolation features. In some such examples, a dielectric is deposited on the conductive material between the plurality of isolation features; a portion of the dielectric adjacent a channel region of the plurality of device fins is recessed; and a gate stack is formed over the channel region. The gate stack is electrically coupled to the conductive material. In some such examples, a dielectric is deposited on the conductive material between the plurality of isolation features; a portion of the dielectric adjacent a source/drain feature of the plurality of device fins is recessed; and a source/drain contact is formed on the source/drain feature. The source/drain contact is electrically coupled to the source/drain feature and to the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin structure and a second fin structure over a substrate;
   forming a dielectric isolation feature between the first fin structure and the second fin structure;
   recessing the second fin structure without recessing the first fin structure;
   forming a conductive material on the recessed second fin structure; and
   forming a gate electrode layer over the first fin structure and directly on the conductive material disposed on the recessed second fin structure such that the gate electrode layer physically contacts the conductive material.

2. The method of claim 1, further comprising:
   forming a dielectric fin structure directly on the conductive material disposed on the recessed second fin structure prior to forming the gate electrode layer; and
   removing the dielectric fin structure to expose the conductive material disposed on the recessed second fin structure prior to forming the gate electrode layer, and
   wherein forming the gate electrode layer directly on the conductive material includes forming the gate electrode layer directly on the exposed portion of the conductive material.

3. The method of claim 1, further comprising:
   forming a gate dielectric layer directly on the first fin structure and directly on the conductive material disposed on the recessed second fin structure prior to forming the gate electrode layer over the first fin structure and directly on the conductive material disposed on the recessed second fin structure; and
   removing the gate dielectric layer to expose the conductive material disposed on the recessed second fin structure prior to forming the gate electrode layer, and
   wherein forming the gate electrode layer directly on the conductive material includes forming the gate electrode directly on the exposed portion of the conductive material.

4. The method of claim 1, further comprising:
   forming a source/drain feature directly on the first fin structure; and
   forming a source/drain contact directly on the source/drain feature, the source/drain contact extending to the conductive material disposed on the recessed second fin structure.

5. The method of claim 1, wherein the first fin structure and the second fin structure are formed of the same semiconductor material.

6. The method of claim 1, wherein after forming the dielectric isolation feature between the first fin structure and the second fin structure the dielectric isolation feature extends continuously from the first fin structure to the second fin structure, and
   wherein after forming the conductive material on the recessed second fin structure the conductive material physically contacts the dielectric isolation feature.

7. The method of claim 1, further comprising forming a dielectric fin structure directly on the conductive material disposed on the recessed second fin structure prior to forming the gate electrode layer, and
   wherein the dielectric fin structure has a top surface that is substantially level with a top surface of the first fin structure.

8. A method comprising:
   forming a first fin structure over a substrate, the first fin structure formed of a semiconductor material;
   forming a second fin structure over the substrate, the second fin structure including the semiconductor material;
   forming a conductive layer directly on the semiconductor material of the second fin structure, wherein the first fin structure is without the conductive layer being disposed thereover after the forming of the conductive layer;
   forming a dielectric layer over the conductive layer;
   removing the dielectric layer from the second fin structure to expose the conductive layer;
   forming a source/drain feature on the first fin structure; and
   forming a contact feature directly on the source/drain feature and directly on a first portion of the exposed conductive layer of the second fin structure.

9. The method of claim 8, further comprising:
forming a dielectric isolation feature on the substrate between the second fin structure and the first fin structure; and
removing a portion of the dielectric isolation feature to expose a sidewall of the dielectric layer.

10. The method of claim 8, wherein the semiconductor material, the conductive layer and the dielectric layer of the second fin structure all have the same width.

11. The method of claim 8, further comprising forming a gate electrode layer directly on a second portion of the exposed conductive layer of the second fin structure such that the gate electrode layer physically contacts the conductive layer.

12. The method of claim 11, further comprising:
forming a gate dielectric layer directly on a portion of the first fin structure, and
wherein forming the gate electrode layer directly on the second portion of the exposed conductive layer of the second fin structure includes forming the gate electrode layer directly on the gate dielectric layer disposed on the portion of the first fin structure.

13. The method of claim 8, wherein a top surface of the first fin structure is substantially level with a top surface of the second fin structure.

14. The method of claim 8, wherein the contact feature extends continuously from the source/drain feature to the conductive layer of the second fin structure.

15. A method comprising:
receiving a substrate;
forming on the substrate:
a plurality of device fins;
a dummy fin; and
a plurality of isolation features disposed between the plurality of device fins and the dummy fin;
recessing the dummy fin to a height below the plurality of isolation features;
depositing a conductive material on the recessed dummy fin between the plurality of isolation features; and
forming a gate electrode over at least one of the device fins from the plurality of device fins and forming the gate electrode directly on the conductive material such that the gate electrode physically contacts the conductive material.

16. The method of claim 15, further comprising:
depositing a dielectric on the conductive material between the plurality of isolation features;
recessing a portion of the dielectric adjacent a channel region of the plurality of device fins; and
forming a gate stack over the channel region, wherein the gate stack is electrically coupled to the conductive material.

17. The method of claim 15, further comprising:
depositing a dielectric on the conductive material between the plurality of isolation features;
recessing a portion of the dielectric adjacent a source/drain feature of the plurality of device fins; and
forming a source/drain contact on the source/drain feature, wherein the source/drain contact is electrically coupled to the source/drain feature and to the conductive material.

18. The method of claim 15, wherein the dummy fin is formed of the same material as the plurality of device fins, and
wherein the dummy fin is wider than at least one of the device fins from the plurality of device fins.

19. The method of claim 8, wherein the first fin structure is without the dielectric layer being disposed thereover after the forming of the dielectric layer over the conductive layer.

20. The method of claim 8, further comprising forming a dielectric isolation structure that extends from the first fin structure to the second fin structure, the dielectric isolation structure having a top surface facing away from the substrate, and
wherein the entire conductive layer is disposed below the top surface of the dielectric isolation structure.

* * * * *